(12) United States Patent
Mahajan et al.

(10) Patent No.: US 11,996,380 B2
(45) Date of Patent: May 28, 2024

(54) FLEXIBLE CIRCUITS ON SOFT SUBSTRATES

(71) Applicant: 3M INNOVATIVE PROPERTIES COMPANY, St. Paul, MN (US)

(72) Inventors: Ankit Mahajan, Cupertino, CA (US); Saagar A. Shah, Minneapolis, MN (US); Daniel B. Taylor, White Bear Lake, MN (US); Mikhail L. Pekurovsky, Bloomington, MN (US); Kara A. Meyers, Oakdale, MN (US); Kayla C. Niccum, Maplewood, MN (US); David J. Rowe, Roseville, MN (US); Gino L. Pitera, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 479 days.

(21) Appl. No.: 17/309,705

(22) PCT Filed: Dec. 23, 2019

(86) PCT No.: PCT/IB2019/061287
§ 371 (c)(1),
(2) Date: Jun. 16, 2021

(87) PCT Pub. No.: WO2020/141407
PCT Pub. Date: Jul. 9, 2020

(65) Prior Publication Data
US 2022/0037278 A1    Feb. 3, 2022

Related U.S. Application Data

(60) Provisional application No. 62/820,112, filed on Mar. 18, 2019, provisional application No. 62/787,165, filed on Dec. 31, 2018.

(51) Int. Cl.
*H01L 23/00* (2006.01)
*H01L 21/56* (2006.01)
(Continued)

(52) U.S. Cl.
CPC ............ *H01L 24/19* (2013.01); *H01L 21/568* (2013.01); *H01L 23/3121* (2013.01);
(Continued)

(58) Field of Classification Search
None
See application file for complete search history.

(56) References Cited

U.S. PATENT DOCUMENTS

2002/0170660 A1* 11/2002 Hashimoto ......... H01L 23/5383
257/E23.173
2005/0093172 A1    5/2005 Tsukahara
(Continued)

FOREIGN PATENT DOCUMENTS

KR    10-2018-0090941    8/2018
WO    20140938091 W    6/2014
(Continued)

OTHER PUBLICATIONS

International Search report for PCT International Application No. PCT/US2019/061287 dated Apr. 8, 2020, 5 pages.

*Primary Examiner* — Evren Seven
(74) *Attorney, Agent, or Firm* — Thomas M. Spielbauer

(57) ABSTRACT

An article includes a solid circuit die on a first major surface of a substrate, wherein the solid circuit die includes an arrangement of contact pads, and wherein at least a portion of the contact pads in the arrangement of contact pads are at least partially exposed on the first major surface of the substrate to provide an arrangement of exposed contact pads; a guide layer including an arrangement of microchannels, wherein the guide layer contacts the first major surface
(Continued)

of the substrate such that at least some microchannels in the arrangement of microchannels overlie the at least some exposed contact pads in the arrangement of exposed contact pads; and a conductive particle-containing liquid in at least some of the microchannels. Other articles and methods of manufacturing the articles are described.

10 Claims, 18 Drawing Sheets

(51) Int. Cl.
*H01L 23/31* (2006.01)
*H01M 50/109* (2021.01)

(52) U.S. Cl.
CPC .......... *H01L 23/3135* (2013.01); *H01L 24/20* (2013.01); *H01L 24/24* (2013.01); *H01L 24/82* (2013.01); *H01L 2224/19* (2013.01); *H01L 2224/211* (2013.01); *H01L 2224/215* (2013.01); *H01L 2224/24137* (2013.01); *H01L 2224/24195* (2013.01); *H01L 2224/82101* (2013.01); *H01L 2924/186* (2013.01); *H01M 50/109* (2021.01)

(56) References Cited

U.S. PATENT DOCUMENTS

| | | |
|---|---|---|
| 2006/0170836 A1 | 8/2006 | Kondo |
| 2008/0150154 A1* | 6/2008 | Hedler ................... H05K 3/101 |
| | | 257/776 |
| 2011/0045577 A1 | 2/2011 | Bruzewicz |
| 2011/0316146 A1 | 12/2011 | Pagaila |
| 2015/0084201 A1 | 3/2015 | Cok |
| 2016/0233196 A1* | 8/2016 | Kim ....................... H01L 25/105 |
| 2017/0077022 A1* | 3/2017 | Scanlan .................. H01L 24/19 |
| 2017/0213755 A1 | 7/2017 | Paek |
| 2019/0229026 A1* | 7/2019 | Kumar ................. H01L 23/5226 |
| 2020/0185331 A1* | 6/2020 | Ghannam ........... H01L 21/4853 |

FOREIGN PATENT DOCUMENTS

| WO | WO 2018-094057 | 5/2018 |
|---|---|---|
| WO | WO 2019-171214 | 9/2019 |

* cited by examiner

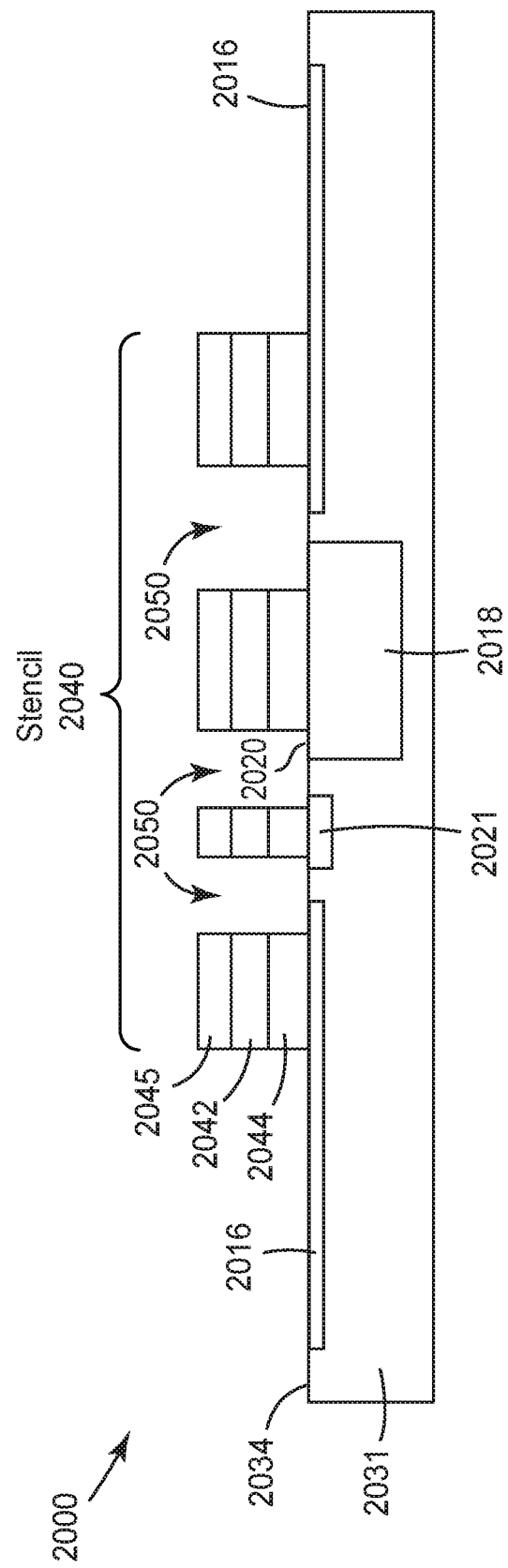

FLEXIBLE CIRCUITS ON SOFT SUBSTRATES

CROSS REFERENCE TO RELATED APPLICATIONS

This application is a national stage filing under 35 U.S.C. 371 of PCT/IB2019/061287, filed Dec. 23, 2019, which claims the benefit of U.S. Application No. 62/787,165, filed Dec. 31, 2018; and U.S. Application No. 62/820,112, filed Mar. 18, 2019, the disclosure of which is incorporated by reference in its/their entirety herein.

BACKGROUND

Integration of solid semiconductor dies with printing techniques combines the computational prowess of semiconductor technology with the high-throughputs and form-factor flexibility of web-based processes. Flexible hybrid electronics manufacturing requires that semiconductor dies be reliably and accurately registered to printed traces on moving webs. Alignment mechanisms suitable for wafer-based semiconductor devices may not be readily transferred to web-based processes.

Techniques are needed to consistently and accurately achieve micron-level registration between solid circuit dies and electrically conductive interconnects on a substrate, in particular, a moving, flexible substrate utilized in a roll-to-roll manufacturing process.

SUMMARY

In general, the present disclosure is directed to articles and methods that provide automatic registration via flow of a conductive particle-containing liquid through a network of microchannels to electrically interconnect aligned or registered contact pads of a circuit die. In some embodiments, the automatic registration described herein can be tolerant of various sources of misalignment in web-based processes such as, for example, a substrate distortion from in-line thermal cycles and/or tension control.

In one aspect, the present disclosure is directed to an article, including: a solid circuit die on a first major surface of a substrate, wherein the solid circuit die includes an arrangement of contact pads, and wherein at least a portion of the contact pads in the arrangement of contact pads are at least partially exposed on the first major surface of the substrate to provide an arrangement of exposed contact pads; a guide layer including an arrangement of microchannels, wherein the guide layer contacts the first major surface of the substrate such that at least some microchannels in the arrangement of microchannels overlie the at least some exposed contact pads in the arrangement of exposed contact pads; and, a conductive particle-containing liquid in at least some of the microchannels.

In another aspect, the present disclosure is directed to an article, including: a first electronic component on a first major surface of a substrate, wherein the first electronic component includes a first arrangement of at least partially exposed contact pads on the first major surface of the substrate; a second electronic component on the first major surface of the substrate, wherein the second electronic component includes a second arrangement of at least partially exposed contact pads on the first major surface of the substrate; a guide layer on the first major surface of the substrate, wherein the guide layer includes an arrangement of microchannels, and wherein at least some microchannels in the arrangement of microchannels include a first end overlying at least some contact pads in the first arrangement of exposed contact pads and a second end overlying at least some contact pads in the second arrangement of contact pads; and, a conductive particle-containing liquid in at least some of the microchannels.

In another aspect, the present disclosure is directed to a method for manufacturing an electronic device, including: placing a solid circuit die with one or more contact pads on a first major surface of a substrate such that the one or more contact pads contacts the first major surface of the substrate to provide an at least partially sealed contact pad; placing an electrically conductive trace on the first major surface of the substrate, wherein the electrically conductive trace has a first exposed major surface and a second surface, wherein the second surface of the electrically conductive trace contacts the first major surface of the substrate to provide an at least partially sealed electrically conductive trace; applying a liquid encapsulant over the first major surface of the substrate and the solid circuit die; hardening the liquid encapsulant to form a carrier comprising a first major surface contacting the first major surface of the substrate and forming an interface therewith; separating the carrier and the substrate at the interface to expose: (1) the at least partially sealed one or more contact pads on the first major surface of the carrier to provide an at least partially exposed one or more contact pads, and (2) the at least partially sealed electrically conductive trace to provide an at least partially exposed electrically conductive trace surface; applying a guide layer on the first major surface of the carrier, wherein the guide layer includes a microchannel with a first end overlying the at least partially exposed contact pad and a second end overlying the exposed at least partially exposed electrically conductive trace surface; depositing a conductive particle-containing liquid in the microchannel to contact the at least partially exposed one or more contact pads and the at least partially exposed electrically conductive trace to form an interconnection therebetween; and, solidifying the conductive particle-containing liquid to form an electrically conductive trace in the microchannel.

In another aspect, the present disclosure is directed to a method for manufacturing an electronic device, including: placing a first electronic component with a first arrangement of contact pads on a first major surface of a flexible polymeric substrate such that the first arrangement of contact pads at least partially embeds in the first major surface of the substrate to provide a first arrangement of embedded contact pads; placing a second electronic component with a second arrangement of contact pads on the first major surface of the substrate such that the second arrangement of contact pads at least partially embeds in the first major surface of the substrate to provide a second arrangement of embedded contact pads; applying a liquid encapsulant over the first major surface of the substrate and the first and the second electronic components; hardening the liquid encapsulant to form a carrier with a first major surface contacting the first major surface of the substrate and forming an interface therewith; separating the carrier and the substrate at the interface to expose on the first major surface of the carrier the first arrangement of embedded contact pads and the second arrangement of embedded contact pads to provide a first arrangement of exposed contact pads extending from the first major surface of the carrier and a second arrangement of exposed contact pads extending from the first major surface of the carrier; forming a guide layer with an arrangement of microchannels; laminating the guide layer to the first major surface of the carrier such that first ends of at least some microchannels in the arrangement of microchannels overlie at least some exposed contact pads of the first arrangement of exposed contact pads and second ends of the at least some microchannels in the arrangement of microchannels overlie at least some exposed contact pads of the second arrangement of exposed contact pads; depositing a conductive particle-containing liquid in the microchannels to contact the at least some exposed contact pads in the first arrangement of exposed contact pads and the at least some exposed contact pads in the second arrangement of exposed contact pads to form an interconnection therebetween; and, solidifying the conductive particle-containing liquid to form electrically conductive traces in the microchannels.

In another embodiment, the present disclosure is directed to a method for manufacturing an electronic device, including: placing a solid circuit die with one or more contact pads on a first major surface of a substrate such that the one or more contact pads contacts the first major surface of the substrate to provide an at least partially sealed contact pad; placing an electrically conductive trace on the first major surface of the substrate, wherein the electrically conductive trace has a first exposed major surface and a second surface, wherein the second surface of the electrically conductive trace contacts the first major surface of the substrate to provide an at least partially sealed electrically conductive trace; applying a liquid encapsulant over the first major surface of the substrate, the solid circuit die and the electrically conductive trace; hardening the liquid encapsulant to form a carrier with a first major surface contacting the first major surface of the substrate and forming an interface therewith; separating the carrier and the substrate at the interface to expose: (1) the at least partially sealed one or more contact pads on the first major surface of the carrier to provide an at least partially exposed one or more contact pads, and (2) the at least partially sealed electrically conductive trace to provide an at least partially exposed electrically conductive trace surface; laminating a guide layer on the first major surface of the carrier, wherein the guide layer includes a microchannel with a first end overlying the at least partially exposed contact pad and a second end overlying the exposed at least partially exposed electrically conductive trace surface; applying a mask layer over the guide layer and the first major surface of the carrier, wherein the microchannel in the guide layer remains exposed; vapor depositing a conductive particle-containing liquid on the mask layer and in the microchannel of the guide layer, wherein the conductive particle-containing liquid contacts the at least partially exposed one or more contact pads and the at least partially exposed electrically conductive trace and form an interconnection therebetween; solidifying the conductive particle-containing liquid to form an electrically conductive trace in the microchannel; and removing the mask layer.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIG. 1A-1 is schematic cross-sectional view of an embodiment of a solid circuit die and an electrically conductive circuit trace on a flexible substrate.

FIG. 1B-1 is schematic cross-sectional view of the construction of FIG. 1A in which the circuit trace and the solid circuit die are covered with a liquid encapsulant material.

FIG. 1C-1 is a schematic cross-sectional view of the construction of FIG. 1B following stripping away the substrate from a carrier formed from the hardened liquid encapsulant material to expose the circuit trace and the contacts on the solid circuit die.

FIG. 10A is a schematic cross-sectional view of a carrier of Example 3 including an electronic device with contact pads, electronic components, and conductive metal traces, wherein the surface of the carrier has applied thereon a guide layer having microchannels overlying at least some of the contact pads, electronic components, and conductive metal traces.

Like symbols in the drawings indicate like elements.

DETAILED DESCRIPTION

Figure 1A:
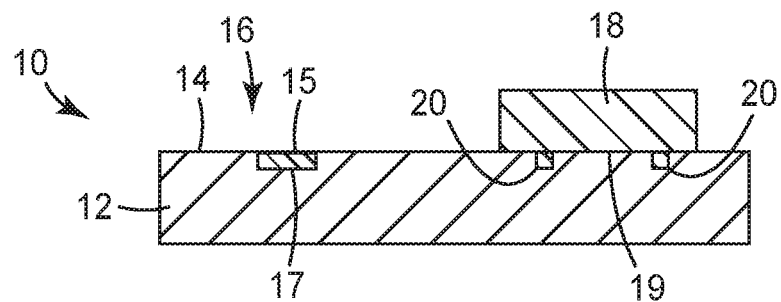
FIG. 1A is schematic cross-sectional view of an embodiment of a solid circuit die and an electrically conductive circuit trace on a flexible substrate.

Referring to FIG. 1A, an article 10 includes a substrate 12 with a first major surface 14. An electrically conductive circuit trace 16 is at least partially embedded in the first major surface 14 of the substrate 12. In the present application, the term embedded refers to a circuit trace or an electronic component that is fixed in the major surface of a substrate such that at least a portion of the circuit trace or the electronic component lies below the major surface of the substrate and is unavailable for electrical interconnection with another circuit trace or an electronic component. A first surface 15 of the circuit trace 16 is exposed on the first major surface 14 of the substrate 12, and a second surface 17 of the circuit trace 16 is embedded below the first major surface 14. In the present application, the term exposed refers to a portion of a circuit trace or an electronic component that is at least partially uncovered and available for electrical interconnection with another circuit trace or electronic component. A solid circuit die 18 also resides on the first major surface 14 of the substrate 12. The solid circuit die 18 includes at least one contact pad 20 on a surface 19 thereof. The contact pads 20 on the solid circuit die 18 are at least partially embedded in the first major surface of the substrate 12.

The substrate 12 can be made of any suitable polymeric material capable of supporting the electrically conductive circuit trace 16 and the solid circuit die 18. In some embodiments, the polymeric material used for the substrate 12 should be softenable to facilitate insertion and embedding of electronic components in the major surface 14 thereof. In some embodiments, which are not intended to be limiting, the flexible substrate 12 is a polymeric film such as, for example, polyethylene terephthalate (PET), polyethylene, polystyrene, polyurethane, and the like. In some embodiments, the substrate 12 or a portion thereof may be rigid, and suitable rigid materials include, but are not limited to, bakelite, acrylonitrile butadiene styrene (ABS), cured epoxy systems, and the like. In some example embodiments, the substrate 12 may have a thickness of, for example, 2 mm or less, 1 mm or less, 500 micrometers or less, or 200 micrometers or less.

The size and configuration of the electrically conductive trace 16 may vary widely, and in some embodiments can include a contact or an elongate strand of electrically conductive material such as, for example metals used for electrical circuit connections like copper, silver, gold, and mixtures and combinations thereof.

In various embodiments, which are not intended to be limiting, the solid circuit die 18 can include a circuit chip having one or more contact pads arranged along the bottom 19 thereof, a rigid semiconductor die, an integrated circuit (IC), a printed circuit board (PCB), a flexible printed circuit (FPC), an ultra-thin chip, a radio frequency identification device (RFID), an electronic module such as a near field communication (NFC) module, and the like. In one non-limiting example, the solid circuit die 18 is an ultra-thin chip with a thickness of about 2 micrometers to about 200 micrometers, about 5 micrometers to about 100 micrometers, or about 10 micrometers to about 100 micrometers. In some embodiments, the ultra-thin circuit die may be loaded on a removable handle substrate (not shown in FIG. 1A) to facilitate the disposition onto the major surface 14 of the substrate 12.

The contact pads 20 may be made of any suitable electrically conductive materials such as, for example, metals. While the contact pad 20 is shown as having a bump-like shape, the contact pads may vary with the specific types of circuit die, and may include, for example, elongate legs extending from the casing of the solid circuit die 18. In some embodiments, the contact pads 20 may include electroplated metals (e.g., copper, silver, gold) on the surface of the casing of the circuit die 18.

In some embodiments, the surface 19 of the solid circuit die 18 can optionally be attached to the first major surface 14 of the substrate 12 with an adhesive (not shown in FIG. 1A). Suitable adhesives include, but are not limited to, structural adhesives, acrylic adhesives, epoxy adhesive, urethane adhesives, optical adhesives, and mixtures and combinations thereof. In some embodiments, the adhesive can be a UV activated or curable adhesive such as, for example, a UV curable polyurethane.

Figure 1B:
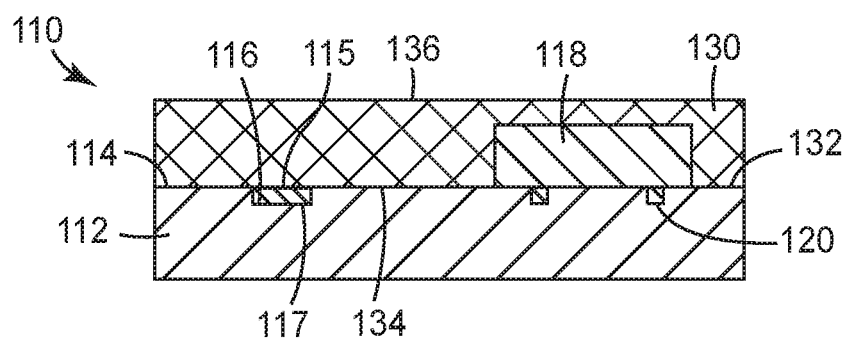
FIG. 1B is schematic cross-sectional view of the construction of FIG. 1A in which the circuit trace and the solid circuit die are covered with a liquid encapsulant material.

Referring to FIG. 1B, an article 110 includes a liquid encapsulant material 130 that has been applied over the major surface 114 of the substrate 112. In various embodiments, the liquid encapsulant material 130 may include, for example, a dielectric material, a polymeric material, and the like. Examples of suitable liquid encapsulant materials 130 include, but are not limited to, polyurethane, epoxy, polythiolene, acrylates including urethane acrylates, silicones, and polydimethylsiloxane (PDMS). The liquid encapsulant material 130 flows around and covers the electrically conductive circuit trace 116 and the solid circuit die 118, and forms an interface 132 with the first major surface 114 of the substrate 112. The liquid encapsulant material 130 does not contact the embedded surface 117 of the conductive trace 116, or the conductive surfaces of the conductive contact pads 120 on the solid circuit die 118.

Once at least partially hardened by any suitable technique including, but not limited to, heating, application of radiation such as ultraviolet (UV), and combinations thereof, the liquid encapsulant material includes a first major surface 134 contacting the first major surface of the substrate 112, and a second major surface 136.

Figure 1C:
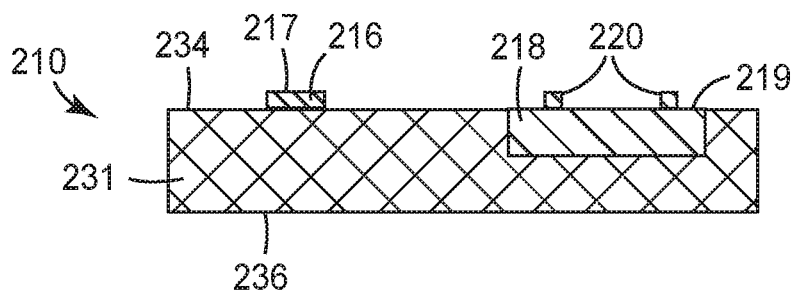
FIG. 1C is a schematic cross-sectional view of the construction of FIG. 1B following stripping away the substrate from a carrier formed from the hardened liquid encapsulant material to expose the circuit trace and the contacts on the solid circuit die.
Figure 1D:
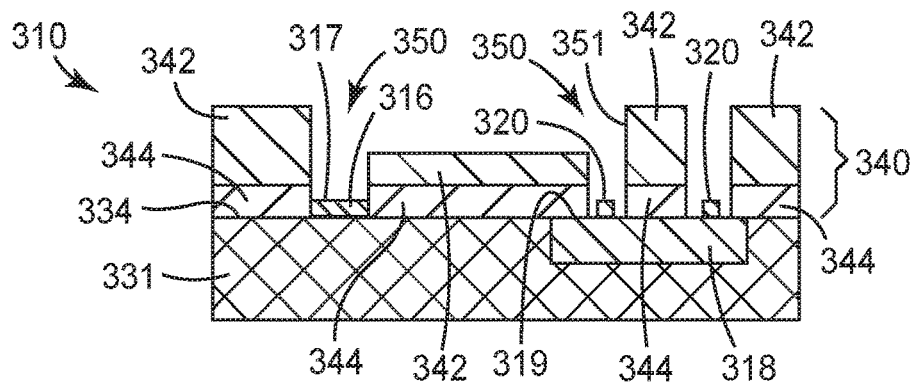
FIG. 1D is a schematic cross-sectional view of the construction of FIG. 1C following application of a microchanneled guide layer.

Referring also to FIG. 1C, in the article 210 the liquid encapsulant material (130 in FIG. 1B) is hardened to form a carrier 231, and the carrier 231 is then removed from the substrate 112 of FIG. 1B. In some embodiments, the substrate 112 of FIG. 1B is stripped from the hardened carrier 231 along the interface 132. The substrate 112 is cleanly removed along the interface 132, which exposes the electrically conductive circuit trace 216 and the solid circuit die 218 on the first major surface 234 of the carrier 231, and leaves the electrically conductive circuit trace 216 and the solid circuit die 218 at least partially embedded in the carrier 231. The electrically conductive circuit trace 216 includes an at least partially exposed surface 217, and the electrically conductive contact pads 220 are at least partially exposed on the surface 219 of the solid circuit die 218. Referring now to FIG. 1D, in an article 310, a temporary (removeable) or permanent (non-removeable) guide layer 340 is applied on the first major surface 334 of the carrier 331. The guide layer 340 includes a pattern or array of microchannels 350, which are filled with a conductive-particle containing liquid that may optionally be at least partially hardened to form conductive traces on the first major surface 334 of the carrier 331. In some embodiments, the guide layer 340 is laminated or otherwise adhered to the carrier 331 strongly enough such that the guide layer is permanent and becomes an integral part of the multilayer structure itself after the conductive traces are formed in the microchannels 350 thereof. In some embodiments, the guide layer 340 is temporarily adhered to the surface 334 of the carrier 331 and subsequently removed after the conductive traces are formed in the microchannels 350, leaving behind the conductive traces on the surface 334.

The guide layer 340 may be made from any material that can support and maintain the dimensions of the microchannels 350 as an electrically conductive particle containing liquid is placed in the microchannels and subsequently at least partially hardened to form electrically conductive traces on the carrier 331. In the embodiment of FIG. 1D, the guide layer 340 includes a polymeric film layer 342 and an optional adhesive layer 344. The optional adhesive layer 344 can be used to enhance adhesion between the guide layer 340 and the surface 334 of the carrier 331. Suitable polymeric films for the polymeric film layer 342 of the guide layer 340 include, but are not limited to, polyethylene terephthalate (PET), polyethylene, polystyrene, polyurethane, and the like. Suitable adhesives for the adhesive layer 344 of the guide layer 340 include, but are not limited to, structural adhesives, acrylic adhesives, epoxy adhesive, urethane adhesives, optical adhesives, and mixtures and combinations thereof. In some embodiments, the adhesive layer 344 can be a UV activated or curable adhesive such as, for example, a UV curable polyurethane.

The guide layer 340 includes an arrangement of microchannels 350, at least some of which extend through the polymeric film layer 342 and the adhesive layer 344 of the guide layer 340, and are configured to align with the exposed surface 317 of the electrically conductive circuit trace 316 and selected contact pads 320 on the surface 319 of the solid circuit die 318. In various embodiments, the microchannels 350 have a minimum dimension (e.g., any of length or width/thickness) of, for example, 500 micrometers or less, 300 micrometers or less, 100 micrometers or less, 50 micrometers or less, or 10 micrometers or less. The microchannels 350 may be formed in the guide layer 340 by any suitable technique such as chemical etching, laser etching or drilling, mechanical punching, casting against a microstructured metal or polymeric tool, and the like. While one arrangement of microchannels 350 is shown in the embodiment of FIG. 1D, it is to be understood that any other numbers of channels can be formed within the guide layer 340, and the channels can be fluidly connected in various configurations.

The microchannels 350, which have sidewalls 351 and a bottom formed by the first major surface 334 of the carrier 331, are configured with dimensions such as widths, depths, and lengths selected to allow a conductive particle-containing liquid placed in the microchannels to flow along the channels. The conductive particle-containing liquid may be placed in the microchannels 350 by any suitable technique, and examples include, but are not limited to, chemical vapor deposition, physical vapor deposition, sputtering, spraying, air knife, gravure, dipping, kiss coating, flood coating, blading, immersion, Meyer rod, roll coating, slot die coating, inkjet printing, lithography, flexographic printing, and mixtures and combinations thereof. In some embodiments, the dimensions of the microchannels 350 are selected such that the conductive particle-containing liquid can be placed in the microchannels 350 and flowed along the channels 350 primarily by capillary force. In some embodiments, the conductive particle-containing liquid can be applied to the microchannels 350 under pressure to enhance capillary flow, or can be moved through the microchannels 350 by a pump, by application of a vacuum, and the like.

Figure 1E:
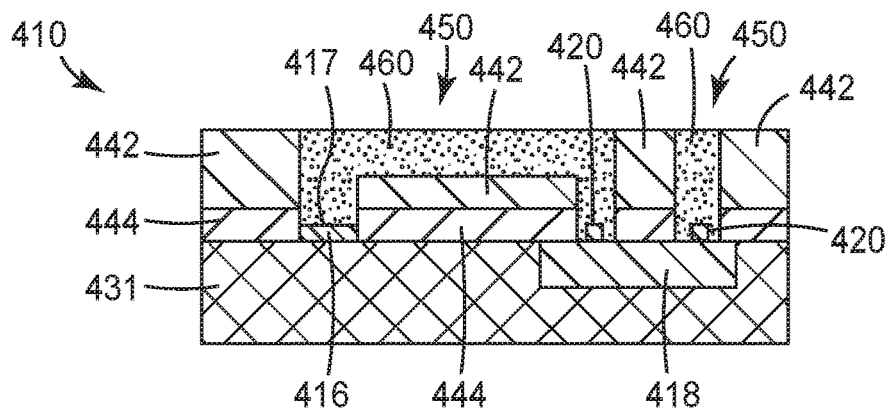
FIG. 1E is a schematic cross-sectional view of the construction of FIG. 1D after flowing a conductive particle-containing liquid in the microchannels in the guide layer to connect the electrically conductive trace and the contact pads on the solid circuit die.

Referring to the article 410 shown in FIG. 1E, a conductive particle-containing liquid 460 is placed in the microchannels 450 and flowed along the microchannels 450 to overlie and make an electrical interconnection between the electrically conductive circuit trace 416 and the contact pads 420 on the solid circuit die 418.

The conductive particle-containing liquid 460 can be any electrically liquid composition containing conductive particles that is flowable, or can be made to flow, in the microchannel 450. In some embodiments, the conductive particle-containing liquid 460 can be formulated to allow flow along the microchannels 450 primarily by a capillary force.

In various embodiments, the conductive particle-containing liquid 460 can be any liquid composition that is electrically conductive in a liquid state (for example, metals), or is electrically non-conductive or weakly conductive in a liquid state and becomes electrically conductive when solidified. In some embodiments, the conductive particle-containing liquid 460 includes a sufficient amount of a liquid carrier to make the conductive particle-containing liquid flowable in the microchannels 450 primarily by a capillary force. In some embodiments, the conductive particle-containing liquid 460 can be made to flow in the microchannels 450 by applying the conductive particle-containing liquid under pressure in the microchannels 450 under pressure to enhance capillary flow.

The conductive particle-containing liquid 460 includes an electrically conductive material, or an electrically non-conductive material that can be converted into an electrically conductive material, which is dispersed in a liquid to facilitate more uniform deposition into the microchannels 450 by using, for example, a coater or sprayer. Suitable electrically conductive materials for the conductive particle-containing liquid 460 include, but are not limited to, metal particles, nanowires, metal salts that are conductive at room temperature or become conductive when heated or otherwise reduced to metals, conductive polymers, and mixtures and combinations thereof. In some embodiments, the conductive particle-containing liquid 460 includes conductive inks including a conductive metal such as silver ink, silver nanoparticle ink, reactive silver ink, copper ink, and conductive polymer inks, as well as liquid metals or alloys (e.g., metals or alloys that melt at relatively low temperatures and solidify at room temperatures), and the like. In some embodiments, the conductive particle-containing liquid 460 is a conductive ink that is activated or curable with actinic radiation such as, for example, a UV curable or activated ink.

In some embodiments, the conductive material in the conductive particle-containing liquid 460 may be silver flakes or spheres, a blend of carbon/graphite particles or a blend of silver flakes/carbon particles. Particle sizes typically range from, for example, about 0.5 micrometers to about 10.0 micrometers in diameter. When these flakes or particles are suspended in the polymer binder, they are randomly spaced through the liquid. Once the solvent is evaporated, they condense, forming a conductive path or circuit. Of the conductive materials, silver is the least resistive and the most expensive while carbon/graphite offers the best combination of low resistance and low price. Suitable conductive inks are available from Tekra, Inc., New Berlin, WI.

Any non-corrosive liquid in which the conductive materials can form a stable dispersion can be used in the conductive particle-containing liquid 460, and suitable examples of liquid carriers include, but are not limited to, water, alcohols, ketones, ethers, hydrocarbons or an aromatic solvent (benzene, toluene, xylene, etc.). In some embodiments, the carrier liquid is volatile, having a boiling point of no more than 200 degrees C. (° C.), no more than 150° C., or no more than 100° C.

In addition, the conductive particle-containing liquid 460 may contain additives or binders to control viscosity, corrosion, adhesion, and dispersion of the conductive material. Examples of suitable additives or binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene glycol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., those available under the trade designation Zonyl from DowDuPont).

In one example, a conductive particle-containing liquid, or "ink," includes, by weight, from 0.0025% to 0.1% surfactant (e.g., a preferred range is from 0.0025% to 0.05% for Zonyl FSO-100), from 0.02% to 4% viscosity modifier (e.g., a preferred range is 0.02% to 0.5% for HPMC), from 94.5% to 99.0% solvent and from 0.05% to 1.4% conductive materials. Representative examples of suitable surfactants include those available from DowDuPont, Wilmington, DE, under the trade designations Zonyl FSN, Zonyl FSO, and Zonyl FSH, those available from Millipore Sigma, St. Louis, MO, under the trade designations Triton (x100, x114, x45), those available from Evonik Industries, Parsippany, NJ, under the trade designations Dynol (604, 607), n-dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, hydroxy ethyl cellulose. Examples of suitable solvents that may be present in a nanowire dispersion that includes the aforementioned binders or additives, include water and isopropanol.

In another embodiment, the conductive particle-containing liquid 460 can include an adhesive such as, for example, adhesives dissolved in liquid solvents such as water acetone, toluene, methyl ethyl ketone (MEK), and the like.

The conductive particle-containing liquid 460 can be cured, hardened or solidified by removing at least portion of the liquid carrier to leave a continuous layer of electrically conductive material that forms an electrically conductive trace in the microchannels 460. The conductive particle-containing liquid 460 may be cured and/or hardened or sintered. "Cured or solidified" refers to a process where the solvent or liquid carrier is removed from the conductive particle-containing liquid 460 to form an interconnect circuit pattern. Suitable curing conditions are well known in the art and include by way of example, heating, irradiating with visible or ultraviolet (UV) light, electron beams, and the like. Alternatively, "harden(s) or hardening" may be caused by solvent removal during drying, for example, without polymerization or cross-linking.

The conductive particle-containing liquid 460 can be delivered at any position along the microchannels 450. The conductive particle-containing liquid 460 can be deposited in the microchannels 450 by various methods including, for example, pouring, funneling, ink jet printing, piezo dispensing, needle dispensing, micro-injection, screen printing, flexographic printing, sputtering, vapor deposition, and the like.

Figure 1F:
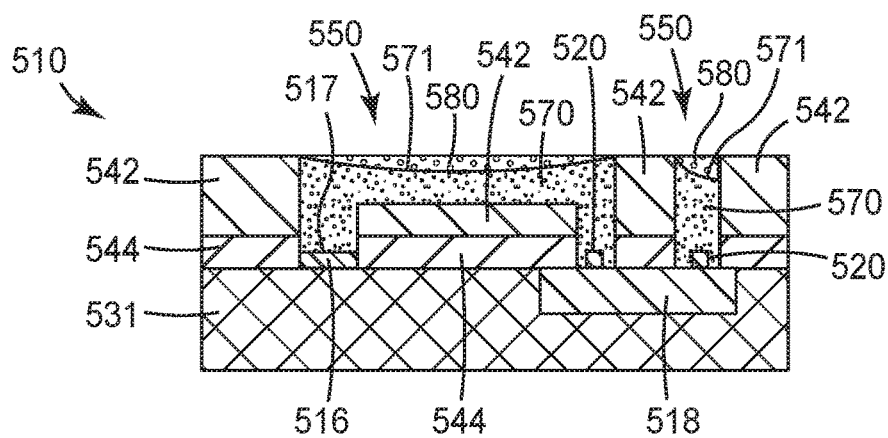
FIG. 1F is a schematic cross-sectional view of the construction of FIG. 1E after the conductive particle-containing liquid is solidified to form electrically conductive traces in the microchannels of the guide layer.

Referring to FIG. 1F, in the article 510 the conductive particle-containing liquid 460 of FIG. 1E can optionally be solidified by removing at least a portion of the liquid carrier therein to form continuous electrically conductive traces 570 in the microchannels 550. Suitable processes that can be used to enhance the solidification of the conductive particle-containing liquid 460 to form the conductive traces 570 may include, for example, curing or evaporating by heat or radiation. During the process of solidification, the volume of the conductive particle-containing liquid 460 decreases when the liquid carrier is removed therefrom. The thickness of the deposited solid material 570 left behind following solidification of the conductive particle-containing liquid 460 depends on the solid loading of the conductive particle-containing liquid 460, but in some embodiments, which are not intended to be limiting, the deposited solid material forming the conductive trace 570 may have a thickness of, for example, from about 0.01 micrometers to about 200 micrometers, from about 0.05 micrometers to about 100 micrometers, or from about 0.1 micrometers to about 10 micrometers.

The solidification process may leave some void space above the surface 571 of the conductive traces 570. In some embodiments, the void space can optionally be filled with an encapsulant material 580 to, for example, protect the conductive traces 570 and the contact pads 520 from corrosion, or to enhance the structural strength of the construction 510. The encapsulant material 580 may include, for example, a dielectric material, a polymeric material, and the like. In some embodiments, the encapsulant material 580 can be delivered by capillary liquid flow to fill the open regions of the microchannel 550 following solidification of the conductive particle-containing liquid 460. The liquid encapsulant can then be solidified to reinforce the contact interface formed between the electrically conductive traces 570 and the contact pads 520 of the solid circuit die 518.

In some embodiments, either or both of the flexible substrates 112 of FIG. 1B and the carrier 231 of FIG. 1C may be a web of a polymeric material having an indefinite length. The web may be used in a high-speed, roll-to-roll manufacturing process to electrically connect circuit components to rapidly produce low-cost circuits for electronic devices including, for example, radio-frequency identification (RFID) tags, near field communication (NFC) circuits, Bluetooth circuits, Wi-Fi circuits, microprocessor chips, and the like.

Figures 1, 1A:
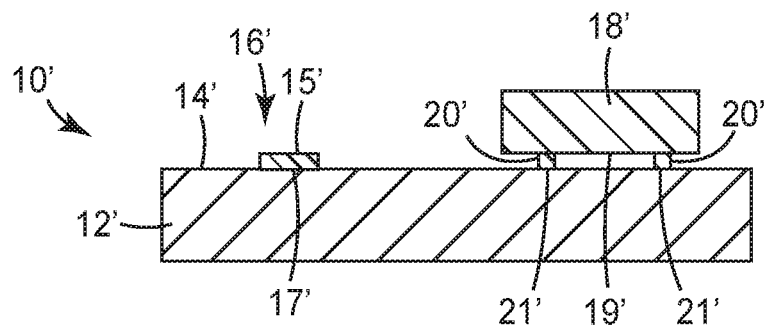
Figures 1, 1B:
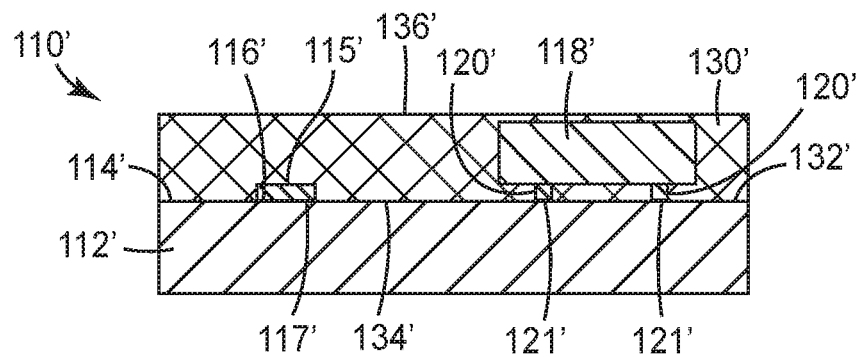
Figures 1, 1C:
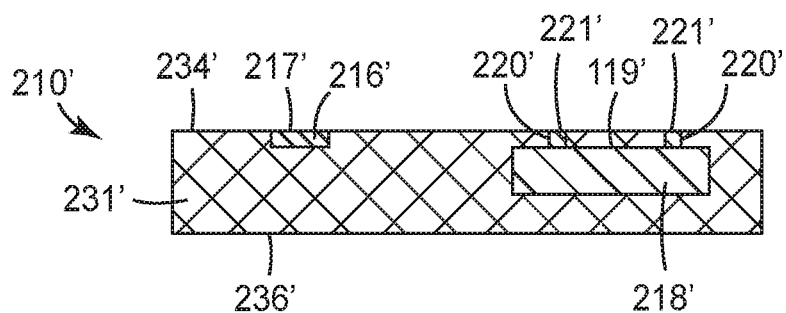

Referring to an alternative embodiment shown schematically in FIG. 1A-1, an article 10' includes a substrate 12' with a first major surface 14'. An electrically conductive circuit trace 16' is placed on the first major surface 14' of the substrate 12'. In the embodiment of FIG. 1A-1, a first surface 15' of the circuit trace 16' is exposed on the first major surface 14' of the substrate 12', and a second surface 17' of the circuit trace 16' contacts the first major surface 14', but is not embedded therein. Similarly, the solid circuit die 18' includes at least one contact pad 20' on a surface 19' thereof. The contact pads 20' on the solid circuit die 18' include surfaces 21' that contact the first major surface 14', but are not embedded therein.

Referring now to FIG. 1B-1, an article 110' includes a liquid encapsulant material 130' that has been applied over the major surface 114' of the substrate 112'. The liquid encapsulant material 130' flows around and covers the electrically conductive circuit trace 116' and the solid circuit die 118', and forms an interface 132' with the first major surface 114' of the substrate 112'. In some embodiments, at least some areas of the surfaces 117' and 121' form a seal against the first major surface 14' sufficient such that the liquid encapsulant 130' material cannot access the sealed areas. However, in some embodiments (not shown in FIG. 1A-1), a small amount of the liquid encapsulant material 130' may seep into gaps between the first major surface 114' of the substrate 112' and the surface 117' of the conductive trace 116', or between the first major surface 114' and the electrically conductive surfaces 121' on the contact pads 120' of the solid circuit die 118', and cover some areas thereof.

Once hardened, the liquid encapsulant material 130' includes a first major surface 134' contacting the first major surface of the substrate 112', and a second major surface 136'.

Referring also to FIG. 1C-1, in the article 210' the liquid encapsulant material 230' is hardened to form a carrier 231', and the carrier 130' in FIG. B-1 is then removed from the substrate 112' of FIG. 1B-1. In some embodiments, the substrate 112' of FIG. 1B-1 is stripped from the hardened carrier 231' along the interface 132'. In some embodiments, the substrate 112' is cleanly removed along the interface 132', which at least partially exposes the surface 217' of the electrically conductive circuit trace 216' and the electrically conductive surfaces 121' on the contact pads 120' of the solid circuit die 218'. However, in some embodiments (not shown in FIG. 1C-1), a layer of hardened encapsulant material 231' may be present on certain areas on the surface 217' and the surfaces 221'. In such cases, at least a portion of the layer of the hardened encapsulant material 231' should be removed from these areas to make as much of the surfaces 217' and 221' available for subsequent electrical interconnection as possible. The layer of the hardened encapsulant material 231' may be removed by a wide variety of processes including, but not limited to, abrasion, chemical etching, reactive ion etching, and the like.

Now that at least some areas of the surfaces 217' and 221' are available for electrical interconnection, a microchanneled guide layer may be applied on the surface 234' as shown in FIG. 1D discussed above, the microchannels may be filled with a conductive particle-containing liquid as shown in FIG. 1E, and then the conductive particle-containing liquid may be hardened as shown in FIG. 1F to form electrically conductive traces in the microchannels.

Figure 2A:
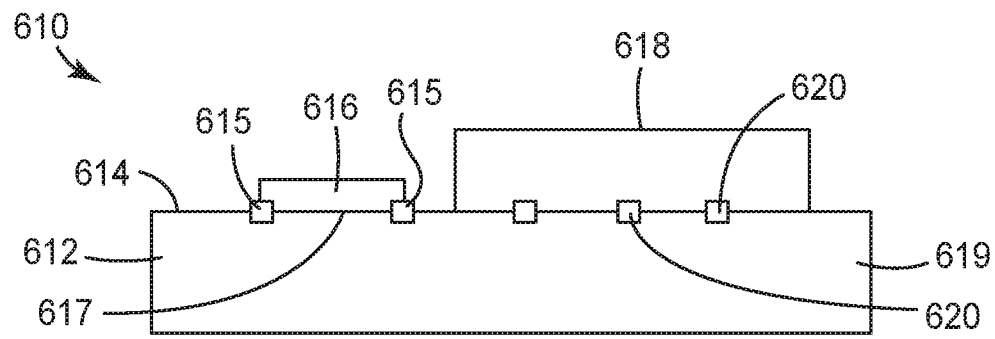
FIG. 2A is schematic cross-sectional view of an embodiment of a first electronic component and a second electronic component on a flexible substrate.

Referring now to FIG. 2A, an article 610 includes a flexible substrate 612 with a first major surface 614. A first electronic component 616 such as, for example, a capacitor, a resistor, an inductor, a diode, or the like, is placed on the first major surface 614 of the flexible substrate 612. The first electronic component 616 includes contact pads 615 on a surface 617 thereof, which are placed on or at least partially embedded in the first major surface 614 of the flexible substrate 612. A second electronic component 618 such as, for example, a RFID chip, an NFC module, a BLUETOOTH module such as those available from Bluetooth SIG Inc, Kirkland, WA, or the like, also resides on the first major surface 614 of the flexible substrate 612. The second electronic component 618 includes at least one contact pad 620 on a surface 619 thereof, which is placed on or at least partially embedded in the first major surface 614 of the substrate 612.

Figure 2B:
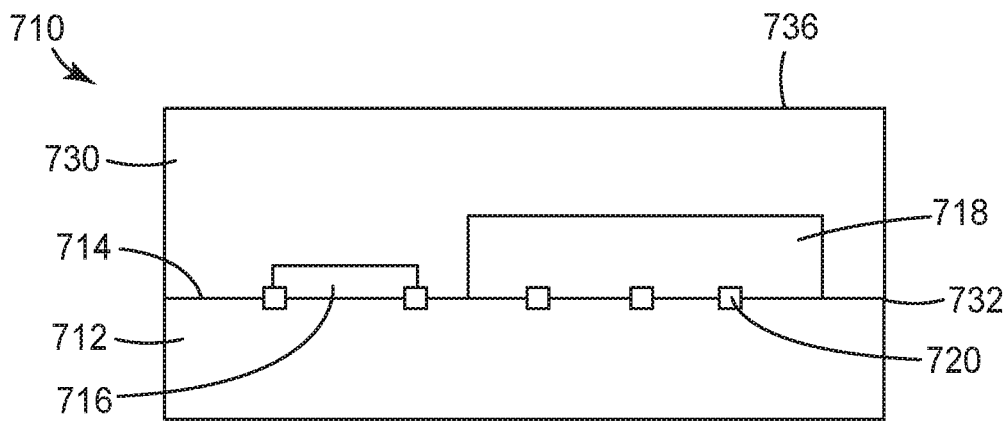
FIG. 2B is schematic cross-sectional view of the construction of FIG. 2A in which the first and the second electronic components are covered with a liquid encapsulant material.
Figure 2C:
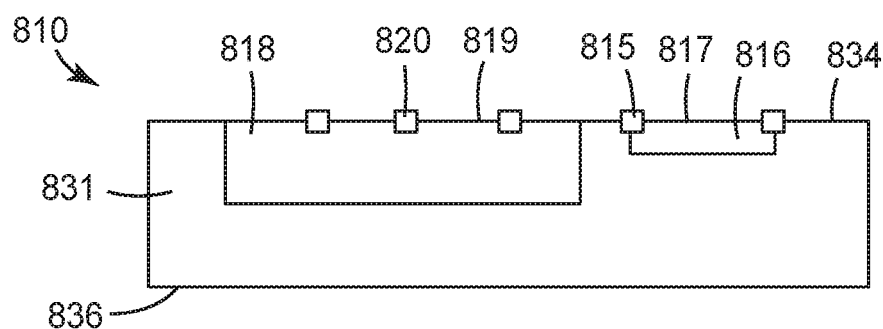
FIG. 2C is a schematic cross-sectional view of the construction of FIG. 2B following stripping away the substrate from the carrier formed from the carrier to expose the circuit trace and the contacts on the solid circuit die.

Referring to FIGS. 2B-2C, an article 710 includes a liquid encapsulant material 730 that has been applied over the major surface 714 of the substrate 712. The liquid encapsulant material 730 flows around and covers the first electronic component 716 and the second electronic component 718, and forms an interface 732 with the first major surface 714 of the substrate 712. Once hardened, the liquid encapsulant material forms a carrier 831 that includes a first major surface 834 contacting the first major surface 714 of the substrate 712, and a second major surface 836.

Referring to FIG. 2C, the hardened encapsulant material 730 in FIG. 2B can be removed from the substrate 712 of FIG. 1B to form the carrier 831. In some embodiments, the substrate 712 of FIG. 1B is stripped from the carrier 831 along the interface 732. The substrate 712 is cleanly removed along the interface 732, which exposes at least a portion of the contact pads 815 on the first electronic component 816, as well as at least a portion of the contact pads 820 on the second electronic component 818, on the first major surface 834 of the carrier 831.

Figure 2D:
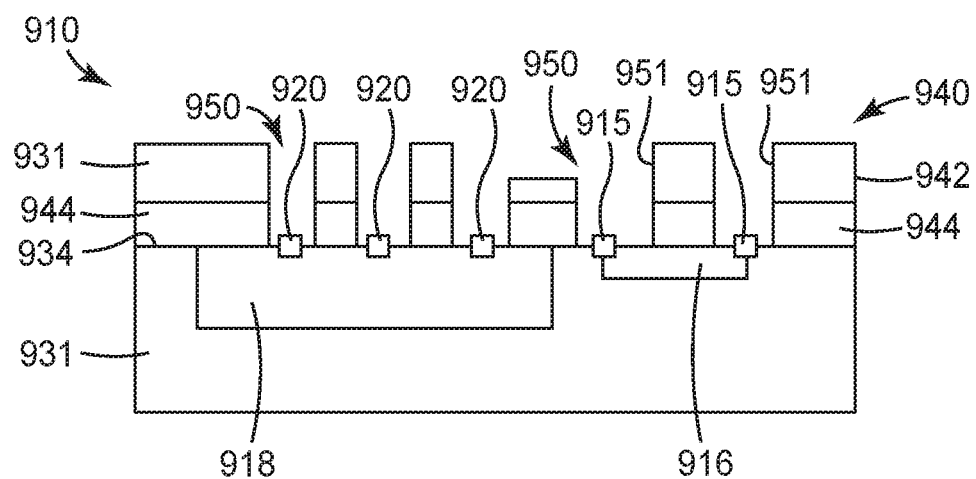
FIG. 2D is a schematic cross-sectional view of the construction of FIG. 2C following application of a microchanneled guide layer.

Referring now to FIG. 2D, in an article 910 a guide layer 940 is applied on the first major surface 934 of the carrier 931. In the embodiment of FIG. 2D, the guide layer 940 includes a polymeric film layer 942 and an optional adhesive layer 944. The guide layer 940 includes an arrangement of microchannels 950, at least some of which extend through the polymeric film layer 942 and the adhesive layer 944 of the guide layer 940, and are configured to align with the exposed surface electrically conductive contact pads 915 on the first electronic component 916 and the electrically conductive contact pads 920 on the second electronic component 918. In various embodiments, the microchannels 350 have a minimum dimension (e.g., any of length or width/thickness) of, for example, 500 micrometers or less, 300 micrometers or less, 100 micrometers or less, 50 micrometers or less, or 10 micrometers or less. While one arrangement of microchannels 350 is shown in the embodiment of FIG. 2D, it is to be understood that any other numbers of channels can be formed within the guide layer 940, and the channels can be fluidly connected in various configurations.

The microchannels 950 are configured with sidewalls 951 that form, along with the first major surface 934 if the carrier 931, conduits with widths, depths, and lengths selected to allow a conductive particle-containing liquid placed in the microchannels to flow along the channels. In some embodiments, the dimensions of the microchannels 950 are selected such that the conductive particle-containing liquid can be flowed along the channels 950 primarily by capillary force. In some embodiments, the conductive particle-containing liquid can be applied to the microchannels 950 under pressure to enhance capillary flow, or can be moved through the microchannels 950 by a pump, by application of a vacuum, and the like.

Figure 2E:
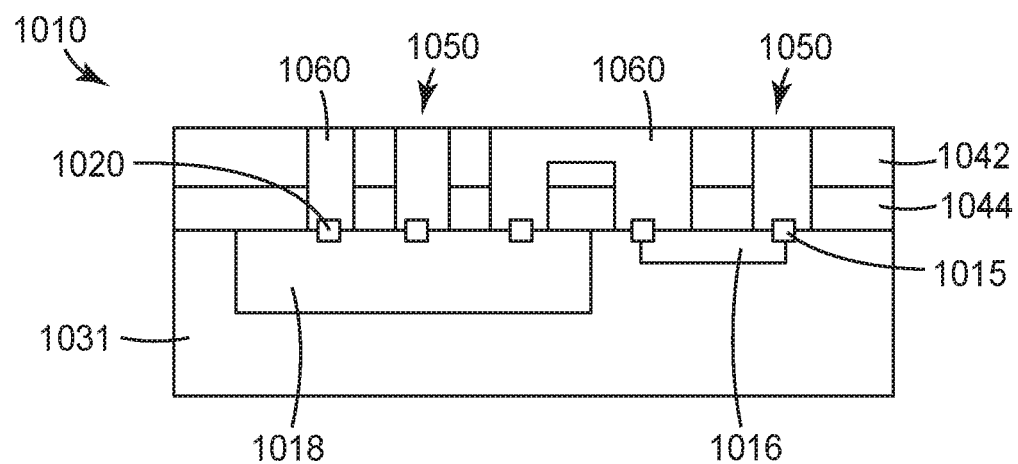
FIG. 2E is a schematic cross-sectional view of the construction of FIG. 2D after flowing an electrically conductive particle-containing liquid in the microchannels in the guide layer to electrically connect the contact pads on the first and the second electronic device.

Referring to the article 1010 shown in FIG. 2E, a conductive particle-containing liquid 1060 is placed in the microchannels 1050 and flowed along the microchannels 1050 to overlie and make an interconnection between the contact pads 1015 on the first electronic device 1016 and the contact pads 1020 on the second electronic device 1018.

The conductive particle-containing liquid 1060 of FIG. 2E is then solidified by removing at least a portion of the liquid carrier therein to form continuous electrically conductive traces in the microchannels 1050 by, for example, curing or evaporating by heat or radiation. The thickness of the deposited solid material left behind following solidification of the conductive particle-containing liquid 1060 depends on the solid loading of the conductive particle-containing liquid 1060, and in some embodiments the deposited solid material forming the conductive traces may have a thickness of, for example, from about 0.01 micrometers to about 200 micrometers, from about 0.05 micrometers to about 100 micrometers, or from about 0.1 micrometers to about 10 micrometers.

The solidification process may leave some void space above the surfaces of the conductive traces, which can optionally be filled with an encapsulant material as discussed above to, for example, protect the conductive traces and the contact pads from corrosion, or to enhance the structural strength of the article.

Figure 9A:
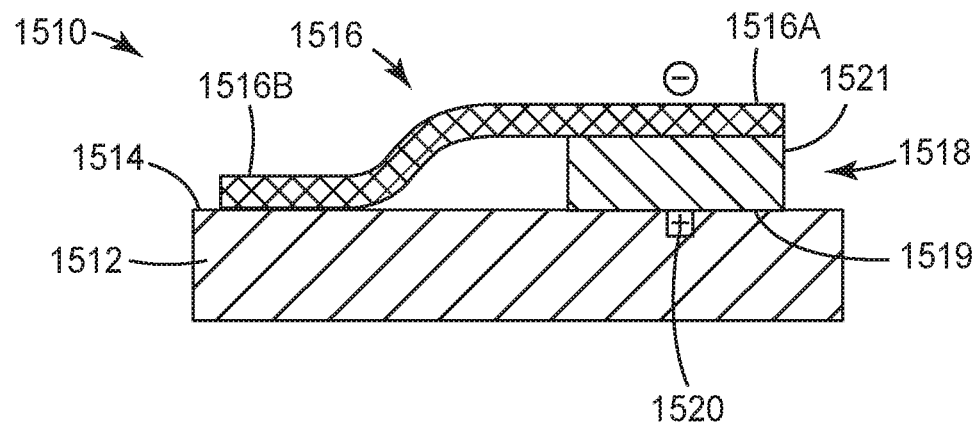
FIG. 9A is schematic cross-sectional view of an embodiment of a battery and an electrically conductive metal flap trace on a flexible substrate.

In another embodiment shown in FIG. 9A, an article 1510 includes a flexible substrate 1512 with a first major surface 1514. A battery 1518 such as, for example, a coin cell battery, is placed on the first major surface 1514 of the flexible substrate 1512. The battery 1518 includes a positive terminal 1520 on a first side 1519 thereof, and a negative terminal at the battery case 1521. A conductive metal flap 1516 such as, for example, a strip of copper, silver, gold, or the like, includes a first end 1516A electrically connected to the battery case 1521, and a second end 1516B on the first major surface 1514 of the substrate 1512. In some embodiments, the conductive metal flap 1516 may optionally be connected to the battery case 1521 by a layer of a conductive adhesive (not shown in FIG. 9A).

Figure 9B:
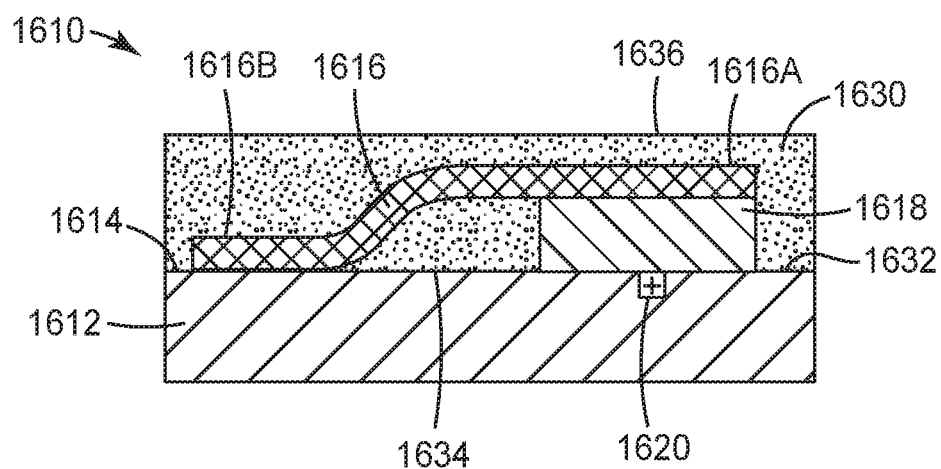
FIG. 9B is schematic cross-sectional view of the construction of FIG. 9A in which the metal flap and the battery are covered with a liquid encapsulant material.
Figure 9C:
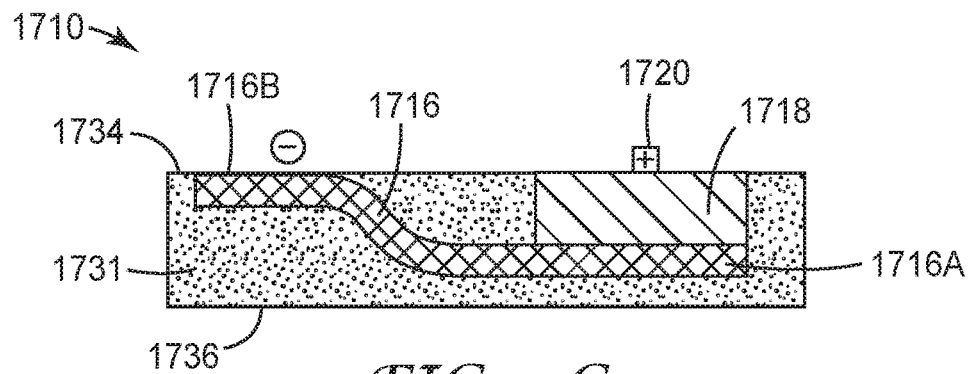
FIG. 9C is a schematic cross-sectional view of the construction of FIG. 9B following stripping away the substrate from a carrier formed from the hardened liquid encapsulant material to expose the metal flap and the contacts on the battery.

Referring to FIGS. 9B-9C, an article 1610 includes a liquid encapsulant material 1630 that has been applied over the major surface 1614 of the substrate 1612. The liquid encapsulant material 1630 flows around and covers the battery 1618 and the conductive flap 1616, and forms an interface 1632 with the first major surface 1614 of the substrate 1612. The encapsulant liquid includes a first major surface 1634 contacting the first major surface 1614 of the substrate 1612, and a second major surface 1636.

Referring again to FIGS. 9B-9C, in the article 1710 the liquid encapsulant material 1630 of FIG. 9B has been hardened to form a carrier 1731, and then removed from the substrate 1612. In some embodiments, the substrate 1612 of FIG. 9B is stripped from the carrier 1731 along the interface 1632. The substrate 1612 is cleanly removed along the interface 1632, which exposes the positive terminal 1720 on the battery 1718, as well as the second end 1716B of the conductive metal flap 1716, on the first major surface 1734 of the carrier 1731.

Figure 9D:
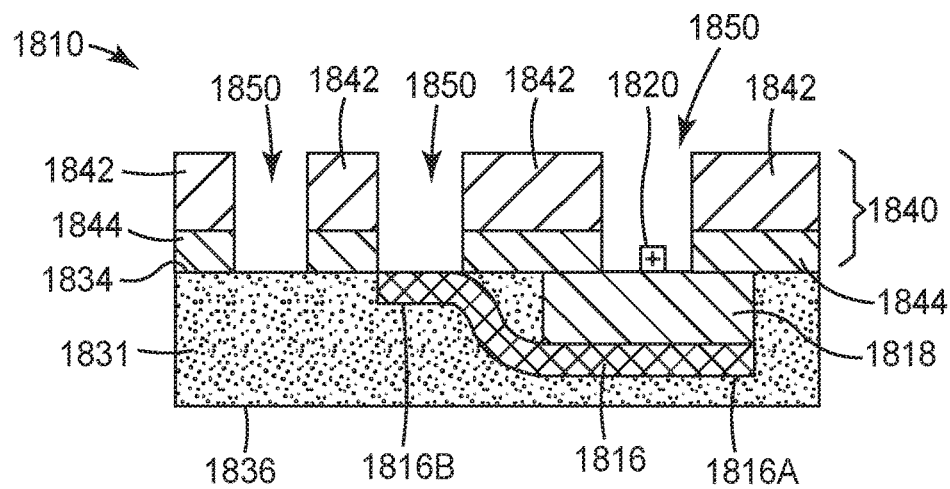
FIG. 9D is a schematic cross-sectional view of the construction of FIG. 9C following application of a microchanneled guide layer.

Referring now to FIG. 9D, in an article 1810, a guide layer 1840 is applied on the first major surface 1834 of the carrier 1831. In the embodiment of FIG. 9D, the guide layer 1840 includes a polymeric film layer 1842 and an optional adhesive layer 1844. The guide layer 1840 includes an arrangement of microchannels 1850, at least some of which extend through the polymeric film layer 1842 and the adhesive layer 1844 of the guide layer 1840, and are configured to align with the exposed surface of the positive terminal 1820 on the battery 1818, as well as the exposed second end 1816B of the conductive metal flap 1816. In various embodiments, the microchannels 1850 have a minimum dimension (e.g. any of length or width/thickness) of, for example, 500 micrometers or less, 300 micrometers or less, 100 micrometers or less, 50 micrometers or less, or 10 micrometers or less.

While one arrangement of microchannels 1850 is shown in the embodiment of FIG. 9D, it is to be understood that any other numbers of channels can be formed within the guide layer 1840, and the channels can be fluidly connected in various configurations.

The microchannels 1850 are configured with sidewalls 1851 that form, along with the first major surface 1834 if the carrier 1831, conduits with widths, depths, and lengths selected to allow a conductive fluid placed in the microchannels to flow along the channels. In some embodiments, the dimensions of the microchannels 1850 are selected such that the conductive particle-containing liquid can be flowed along the channels 1850 primarily by capillary force. In some embodiments, the conductive particle-containing liquid can be applied to the microchannels 1850 under pressure to enhance capillary flow, or can be moved through the microchannels 1850 by a pump, by application of a vacuum, and the like.

Figure 9E:
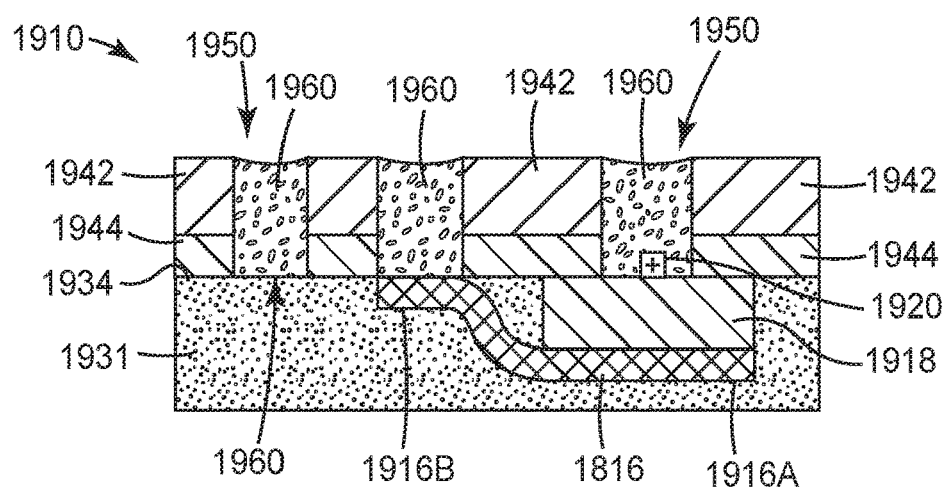
FIG. 9E is a schematic cross-sectional view of the construction of FIG. 9D after flowing a conductive particle-containing liquid in the microchannels in the guide layer to connect the electrically conductive metal flap and the contact pads on the battery.

Referring to the article 1910 shown in FIG. 9E, the conductive particle-containing liquid 1960 is placed in the microchannels 1950 and flowed along the microchannels 1950 to overlie and make an interconnection between the positive terminal 1920 of the battery 1918 and the second end 1916B of the conductive metal flap 1916. The conductive particle-containing liquid 1960 of FIG. 9E can then be solidified by removing at least a portion of the liquid carrier therein to form continuous electrically conductive traces in the microchannels 1950 by, for example, curing or evaporating by heat or radiation.

The solidification process may leave some void space above the surfaces of the conductive traces, which can optionally be filled with an encapsulant material as discussed above to, for example, protect the conductive traces and the contact pads from corrosion, or to enhance the structural strength of the article.

In another aspect, the present disclosure is directed to methods for manufacturing an electronic device including applying a microchanneled guide layer over exposed contacts on an electronic device embedded in a substrate.

Figure 3:
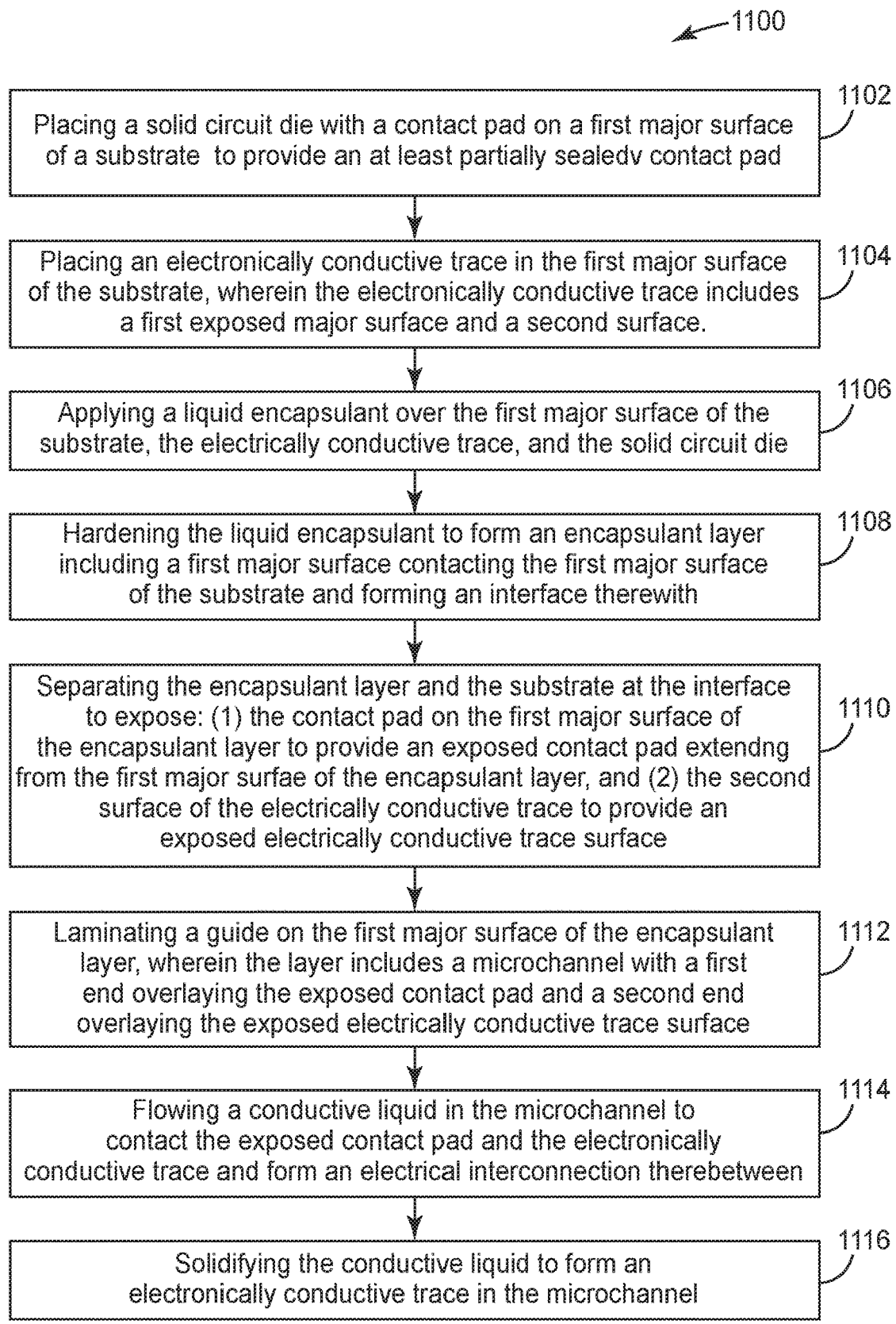
FIG. 3 is a flow chart outlining an embodiment of a method for making the articles shown in FIGS. 1A-1F.

In one embodiment, referring generally to the articles in FIGS. 1A-1F discussed in detail above, the method 1100 of FIG. 3 includes a step 1102 of placing a solid circuit die with one or more contact pads on a first major surface of a substrate such that the one or more contact pads embed in the first major surface of the substrate to provide an embedded contact pad.

Step 1104 includes embedding an electrically conductive trace in the first major surface of the substrate, wherein the electrically conductive trace includes a first exposed major surface and a second embedded surface.

Step 1106 includes applying a liquid encapsulant over the first major surface of the substrate, the electrically conductive trace, and the solid circuit die.

Step 1108 includes hardening the liquid encapsulant to form a carrier including a first major surface contacting the first major surface of the substrate and forming an interface therewith.

Step 1110 includes separating the carrier and the substrate at the interface to expose: (1) the embedded one or more contact pads on the first major surface of the carrier to provide an exposed one or more contact pads extending from the first major surface of the carrier, and (2) the second embedded surface of the electrically conductive trace to provide an exposed electrically conductive trace surface.

Step 1112 includes laminating a guide layer on the first major surface of the carrier, wherein the guide layer includes a microchannel with a first end overlying the exposed contact pad and a second end overlying the exposed electrically conductive trace surface.

Step 1114 includes flowing an electrically conductive particle-containing liquid in the microchannel to contact the exposed contact pad and the electrically conductive trace to form an electrical interconnection therebetween.

In an optional step 1116, the electrically conductive particle-containing liquid is solidified to form an electrically conductive trace in the microchannel.

Figure 4:
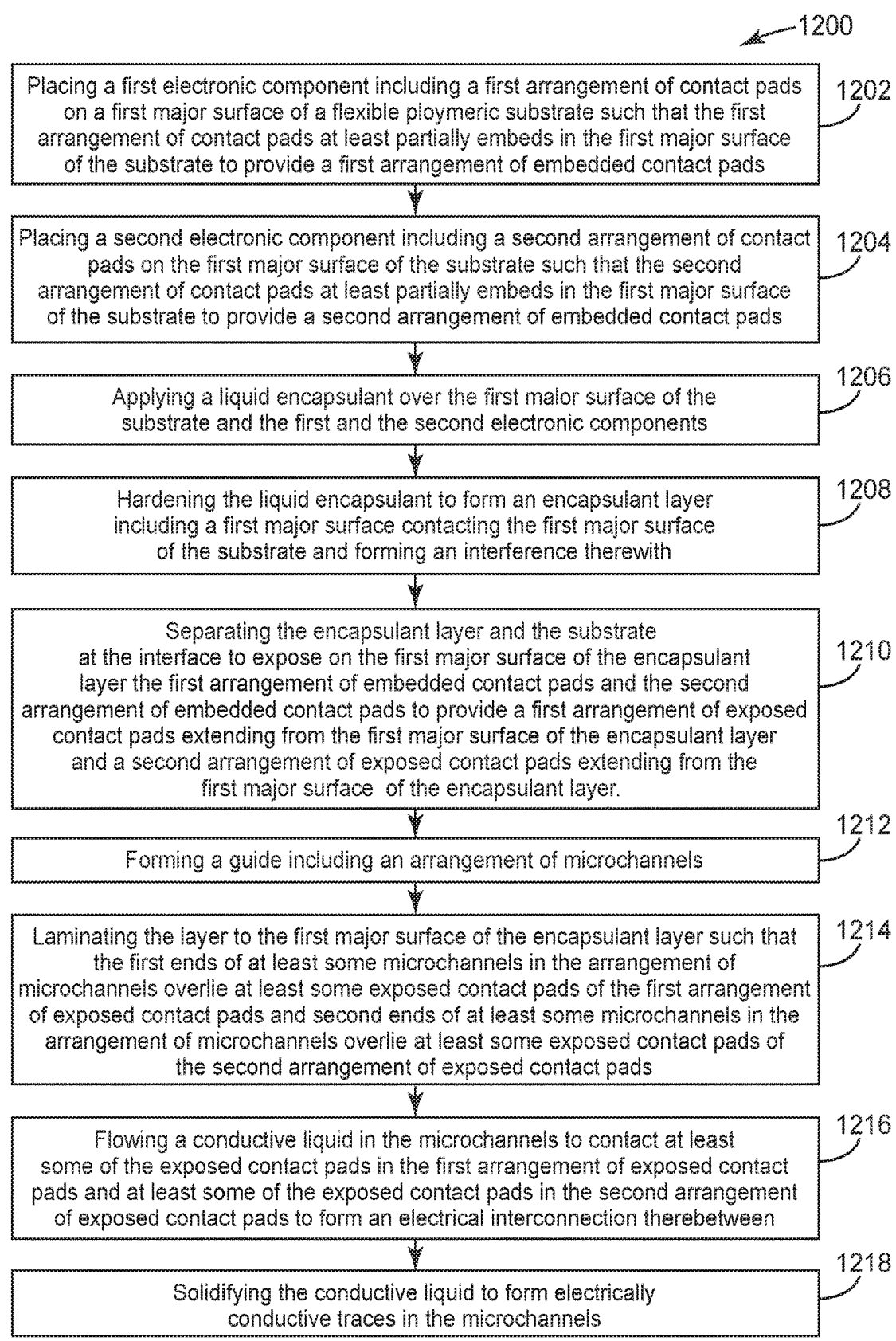
FIG. 4 is a flow chart outlining an embodiment of a method for making the articles shown in FIGS. 2A-2E.

In another embodiment shown in FIG. 4, referring generally to the articles in FIGS. 2A-2E discussed in detail above, a method for manufacturing an electronic device 1200 includes a first step 1202 of placing a first electronic component with a first arrangement of contact pads on a first major surface of a flexible polymeric substrate such that the first arrangement of contact pads embeds in the first major surface of the substrate to provide a first arrangement of embedded contact pads.

In step 1204, a second electronic component with a second arrangement of contact pads is placed on the first major surface of the substrate such that the second arrangement of contact pads embeds in the first major surface of the substrate to provide a second arrangement of embedded contact pads.

Step 1206 includes applying a liquid encapsulant over the first major surface of the substrate and the first and the second electronic components.

Step 1208 includes hardening the liquid encapsulant to form a carrier including a first major surface contacting the first major surface of the substrate and forming an interface therewith.

In step 1210 the carrier and the substrate are separated at the interface to expose on the first major surface of the carrier the first arrangement of embedded contact pads and the second arrangement of embedded contact pads to provide a first arrangement of exposed contact pads extending from the first major surface of the carrier and a second arrangement of exposed contact pads extending from the first major surface of the carrier.

Step 1212 includes forming a guide layer including an arrangement of microchannels.

Step 1214 includes laminating the guide layer to the first major surface of the carrier such that first ends of at least some microchannels in the arrangement of microchannels overlie at least some exposed contact pads of the first arrangement of exposed contact pads and second ends of the at least some microchannels in the arrangement of microchannels overlie at least some exposed contact pads of the second arrangement of exposed contact pads.

Step 1216 includes flowing an electrically conductive particle-containing liquid in the microchannels to contact the at least some exposed contact pads in the first arrangement of exposed contact pads and the at least some exposed contact pads in the second arrangement of exposed contact pads to form an electrical interconnection therebetween.

Optional step 1218 includes solidifying the electrically conductive particle-containing liquid to form electrically conductive traces in the microchannels.

Figure 11:
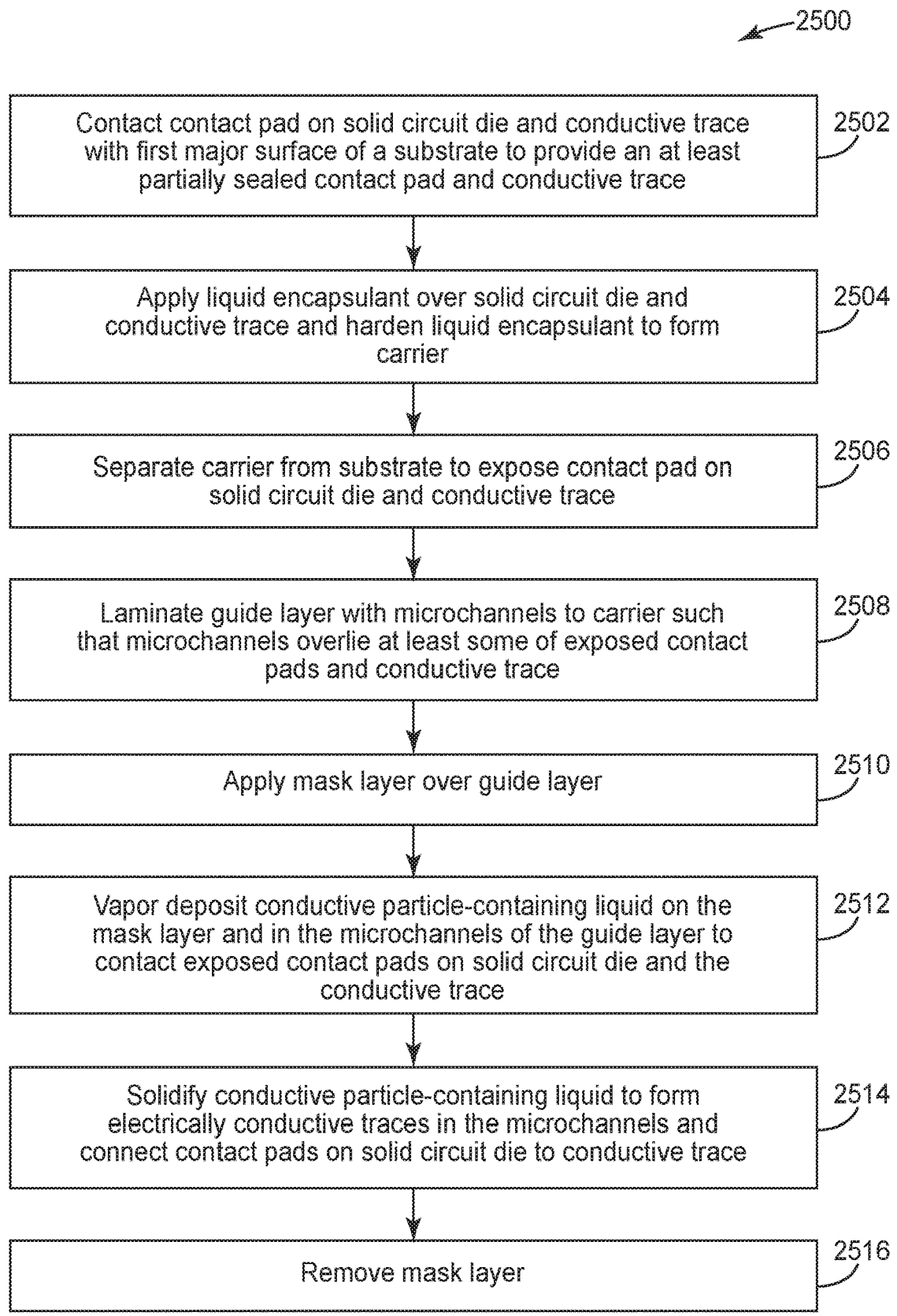
FIG. 11 is a flowchart illustrating a method for electrically connecting a first and a second electronic device.

Referring to another embodiment shown in FIG. 11, a method 2500 for manufacturing an electronic device includes a step 2502 in which a solid circuit die with one or more contact pads is placed on a first major surface of a substrate such that the one or more contact pads contacts the first major surface of the substrate to provide an at least partially sealed contact pad. An electrically conductive trace is also placed on the first major surface of the substrate, wherein the electrically conductive trace has a first exposed major surface and a second surface, wherein the second surface of the electrically conductive trace contacts the first major surface of the substrate to provide an at least partially sealed electrically conductive trace.

In step 2504, a liquid encapsulant is applied over the first major surface of the substrate, the solid circuit die and the electrically conductive trace, and the liquid encapsulant is hardened to form a carrier with a first major surface contacting the first major surface of the substrate and forming an interface therewith.

In step 2506, the carrier and the substrate are separated at the interface to expose: (1) the at least partially sealed one or more contact pads on the first major surface of the carrier to provide an at least partially exposed one or more contact pads, and (2) the at least partially sealed electrically conductive trace to provide an at least partially exposed electrically conductive trace surface.

In step 2508, a guide layer is laminated on the first major surface of the carrier, wherein the guide layer includes a microchannel with a first end overlying the at least partially exposed contact pad and a second end overlying the exposed at least partially exposed electrically conductive trace surface. In various embodiments, the microchannel can be formed in the guide layer by a process chosen from microreplication, laser drilling, and combinations thereof.

In step 2510, a mask layer is applied over the guide layer and the first major surface of the carrier, wherein the microchannel in the guide layer remains expose In step 2512, a conductive particle-containing liquid is vapor deposited on the mask layer and in the microchannel of the guide layer, wherein the conductive particle-containing liquid contacts the at least partially exposed one or more contact pads and the at least partially exposed electrically conductive trace and forms an interconnection therebetween.

In step 2514, the conductive particle-containing liquid is solidified to form an electrically conductive trace in the microchannel.

In step 2516, the mask layer is removed.

In some embodiments of the method 2500 described in FIG. 11, the guide layer further includes an optional release liner on an exposed surface thereof, and the release liner is removed from the guide layer after removing the mask layer.

In some embodiments of the methods discussed above, the substrate can have a registration feature shaped to receive the electronic component, and at least one channel shaped to extend away from an area that corresponds with one of the contacts when the electronic component is disposed within the registration feature.

In the present disclosure, the conductive particle-containing liquid delivered into the channels can automatically register with the circuit dies by wetting out, in some preferred embodiments via capillary action, various surfaces of registration features and circuit dies on the substrate (e.g., channel walls, side walls of the pocket, side surfaces of the circuit die, etc.). The flow of the conductive particle-containing liquid on the various capillary surfaces can be automatically directed at least in part by capillary force, which makes optional the use of fluid pumps, vacuum and the like to pump the electrically conductive fluid toward the circuit die or the conductive traces registered with the substrate. After the automatic registration, the conductive particle-containing liquid can be further solidified to form a solid, continuous layer. The process can be repeated to form a multilayer structure aligned with the solid circuit die on the substrate.

In some embodiments, after the formation of electrically conductive traces in the microchannels, the microchannels can be optionally filled with an encapsulant material to protect the structure of the conductive traces or the contact pads on the electronic device. The encapsulant material may include, for example, a dielectric material, a polymeric material, and the like. In some embodiments, the encapsulant material can be delivered via capillary liquid flow to fill the microchannels. The encapsulant liquid can then be solidified to form a carrier to protect the underneath traces, circuit dies, and contacts formed therebetween.

When electrically conductive traces are formed and automatically registered with contact pads on circuit dies, the traces can be connected concurrently, or at a later time, to other portions of a circuit or other circuits or devices. In some embodiments, additional metal traces (e.g., copper, silver, gold traces) can be patterned in registration to the electrically conductive traces. In some embodiments, for example, the electrically conductive traces can be connected to an antenna coil of an electronic device such as a receiver or transmitter. In some example embodiments, which are not intended to be limiting, the processes described herein can be used to make various chip-based circuits/devices including, for example, radio-frequency identification (RFID) tags, near field communication (NFC) circuits, Bluetooth circuits, Wi-Fi circuits, microprocessor chips, and the like.

The devices and methods of the present disclosure will now be further described in the following non-limiting examples.

EXAMPLES

Example 1

A circuit die with contact pads on the underside was placed on a softened thermoplastic film liner obtained from EXCO, Daegu, Korea. The thermoplastic liner was about 6.92 mils (0.18 mm) thick and consisted of a 20-30 micrometer thick layer of polyethylene on PET. The thermoplastic liner softened at 120-150° C. A small force was applied to push the contact pads of the die into the molten film by about 2-10 micrometers. The thermoplastic film was then cooled down to room temperature.

An encapsulating coating of polydimethylsiloxane (PDMS) was applied on the thermoplastic film such that the coating thickness exceeded the height of the die. The coating was cured using a combination of heat and ultraviolet (UV) light for about 24-48 hours at room temperature to form a carrier.

The carrier was then peeled off the thermoplastic film. The solid circuit die was transferred to the carrier such that the top surface of the chip and the exposed major surface of the carrier were nearly flush.

A guide layer was fabricated by depositing a polymeric microreplication material, in this example PET, on a 2-3 mil (0.6 mm) thick layer of an adhesive available from 3M, St. Paul, MN, under the trade designation VHB. The adhesive layer was in turn provided on a release liner of 4 mil (0.10 mm) paper. An arrangement of microchannels was microreplicated in the polymeric material by contacting a structured tool with the liquid polymeric resin, curing with heat and UV, and removing the structured tool to provide a liner/adhesive/structured polymeric film construction.

In various embodiments, the guide layer consisted of a 4 mil (0.10 mm) paper liner, a layer of 2-3 mil (0.06 mm) VHB adhesive, and 3 mil (0.08 mm) PET for a total thickness of 10 mils (0.25 mm). An alternative guide layer construction included 4 mil (0.10 mm) of paper liner, 2-3 mils (0.06 mm) of VHB adhesive, 1 mil (0.025 mm) polyurethane film, and 1 mil (0.025 mm) PET liner.

The film stack was drilled with a laser so that the laser cut through all three layers to form a guide layer with a pattern of microchannels corresponding to the configuration of the contact pads on the solid circuit die, as well through holes where connections needed to be made. The laser used to make the guide layer was an Avia 7 UV 355 nm laser (obtained from Coherent® of Santa Clara, CA United States) with a power of about 3.5-3.6 W. The laser was directed at the liner side of the layered film construction and moved over the layered film construction in 20-30 passes at a speed of 500 mm/sec, with a hatch spacing of 0.025 mm.

The microchannels formed in the guide layer were linear with a generally rectangular cross-section, a depth of about 150 micrometers, and a width of about 200 micrometers.

The release liner was removed, and the PET/adhesive guide layer was then laminated to the cured carrier such that the microchannel openings in the guide layer lined up over the exposed contact pads of the solid circuit die. The adhesive formed a liquid seal between the guide layer and the surface of the carrier on which the adhesive was applied.

A silver nanoparticle ink available under the trade designation DSPI-420 from Novacentrix, Austin, TX United States with a 40% silver loading was then flowed, by capillary force, in the hybrid microchannels (sidewalls from the guide layer and the bottom from the exposed surface of the carrier) to make contact to the contact pads of the solid circuit die. The silver ink was solidified by heating at 110° C. for about 5 to 10 minutes to form electrically conductive traces.

Example 2

Figure 5:
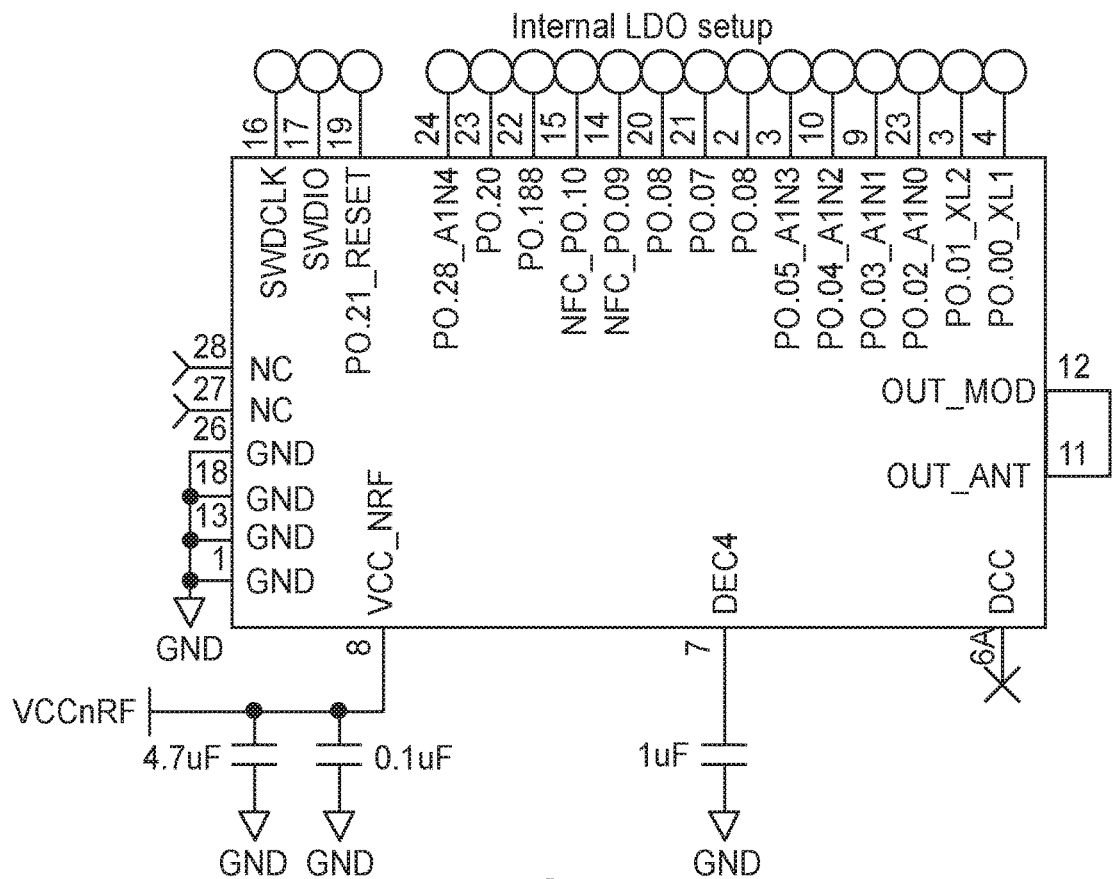
FIG. 5 is a circuit diagram of the BLUETOOTH module used in Example 2 below.

A BLUETOOTH module Taiyo Yuden model EYSHSNZWZ obtained from DigiKey, Thief River Falls, MN United States with the internal circuit arrangement and contact pad pattern shown schematically in FIG. 5 was placed on a softened flexible substrate as outlined in Example 1 above such that the contacts thereon were embedded in the substrate.

A coating of PDMS (Example 1) was applied on the thermoplastic film such that the coating thickness exceeded the height of module, and the coating was cured using a combination of heat and ultraviolet (UV) light as set forth above in Example 1.

The coating was cured to form a carrier, which was then peeled off the thermoplastic film. The module was transferred to the cured carrier such that the top surface of the module and the exposed surface of the carrier were nearly flush.

A film stack with a layered construction including polymeric film liner/adhesive/PET film was exposed to a laser-drilling process as set forth in Example 1 so that the laser cut through all three layers to form a guide layer with a pattern of microchannels. The guide layer included an arrangement of microchannels 1300 as shown schematically in FIG. 6, which were configured to correspond to selected contact pads on the BLUETOOTH module.

Figure 6:
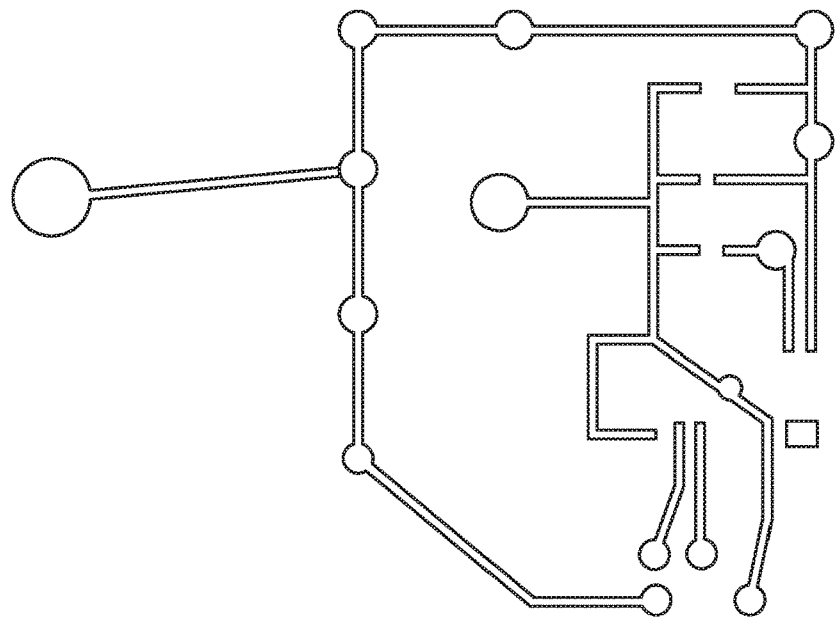
FIG. 6 is an overhead view of the pattern of microchannels used to electrically interconnect with the contact pads of the module of FIG. 5.
Figure 7:
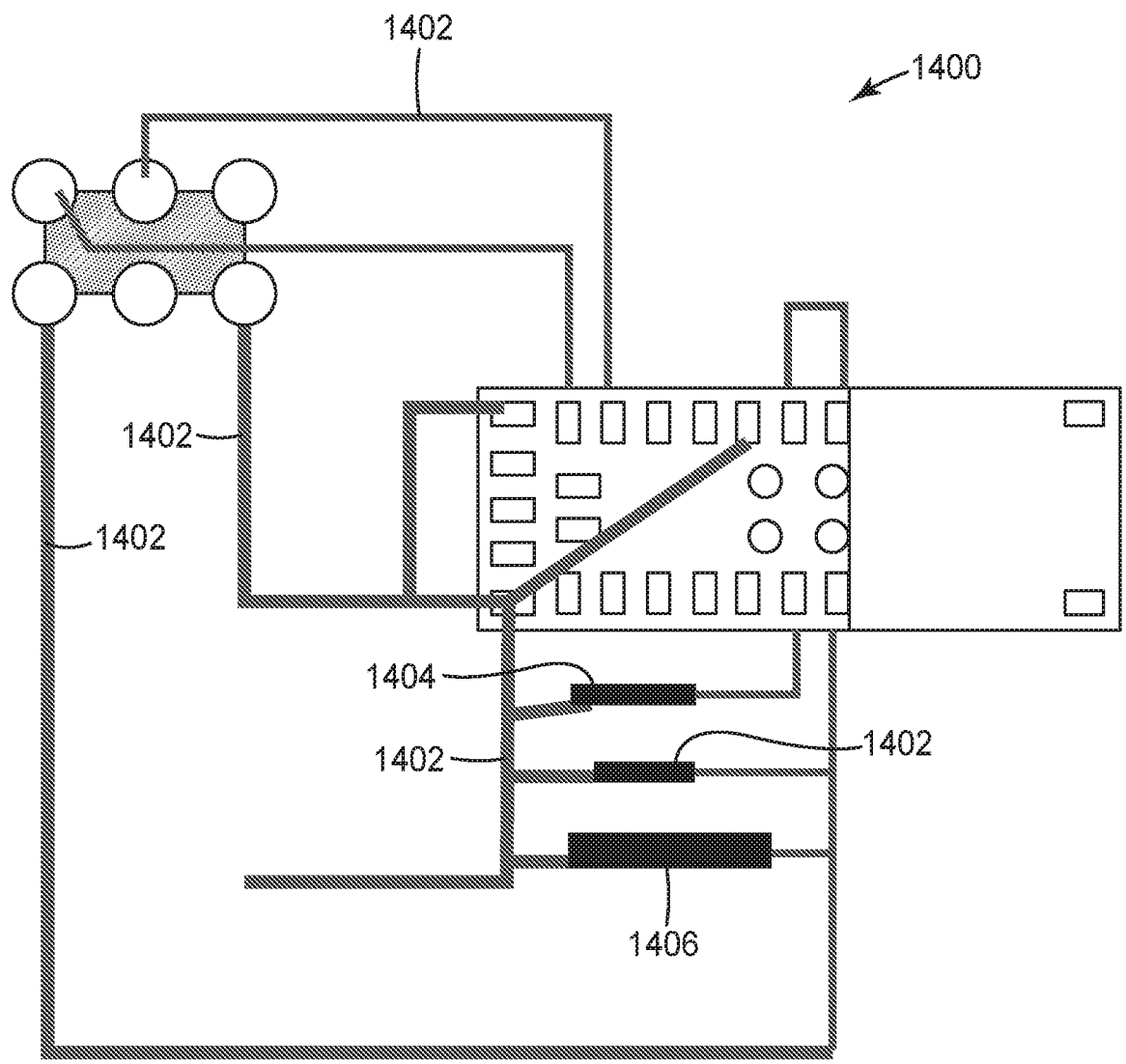
FIG. 7 is a schematic overhead view of the electrically conductive circuit traces formed by flowing a conductive particle-containing liquid into the microchannel pattern of FIG. 6 and solidifying the conductive particle-containing liquid.

The microchannels 1300 in FIG. 6 were filled with the silver ink of Example 1, which was solidified as set forth in Example 1 to form the arrangement of circuit traces 1400 shown in FIG. 7 and electrically connected to the contact pads of the BLUETOOTH module. The circuit trace arrangement 1400 included a first group of circuit traces 1402 having dimensions of 1 mm×0.5 mm×0.5 mm and a capacitance of 0.1 µF, a second group of microchannels 1404 having dimensions 1.6 mm×0.8 mm×0.5 mm and a capacitance of 1 µF, and a third group of microchannels 1406 having dimensions 2 mm×1.25 mm×0.5 mm and a capacitance of 4.7 µF.

Figure 8:
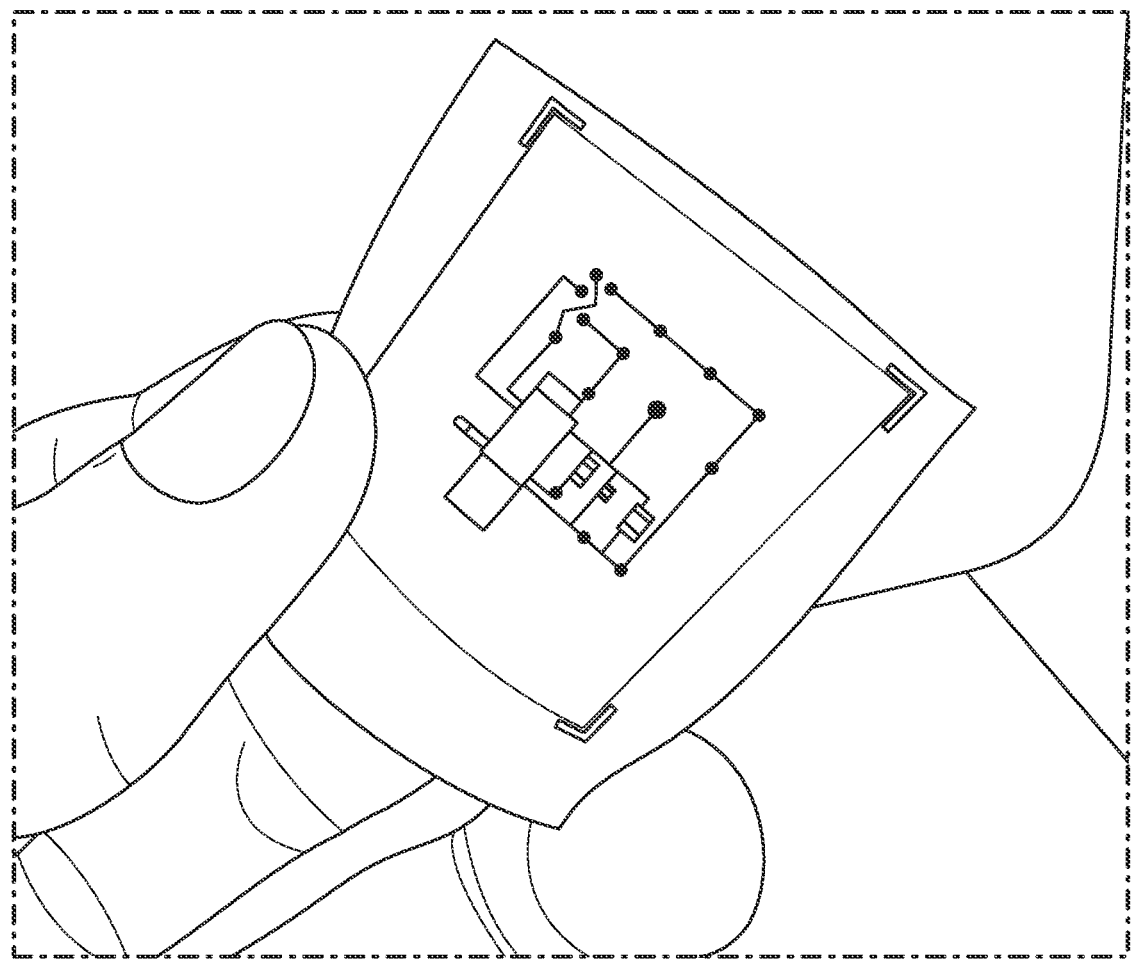
FIG. 8 is a photograph of the electric circuit on a flexible substrate formed by the process described in Example 2.

The completed electronic circuit on the flexible substrate is shown in FIG. 8.

Example 3

A low-tack adhesive transfer tape (JH-Best Crafts 12"×10' Feet Roll Transfer Paper w/Grid, purchased from Amazon, 4 mil (0.10 mm) thick) was laminated to 1 mil (0.025 mm) thick copper foil. A guide layer of the same low-tack adhesive transfer tape was prepared by laser-cutting the tape to create meandering traces (600 micrometers wide) and then applied to the second side of the copper foil. A resist (Rust-oleum High Performance Enamel) was spray painted onto the exposed surface of the copper through the guide layer then dried. The adhesive guide layer was then removed, leaving behind a patterned resist on one side of the copper foil, and leaving the other side laminated to the low-tack adhesive transfer tape. The exposed copper was then etched with etchant, leaving behind copper traces in the pattern of the resist and exposing the transfer tape in areas without a resist.

A circuit die (Zero-Drift Amplifier 1 Circuit Rail-to-Rail 8-LFCSP-WD from Analog Devices Inc., Norwood, MA United States), a 200 kOhm resistor (part number ERA-3AEB204V from Panasonic Electronic Components, Newark, NJ United States), and a 10 kOhm resistor (part number ERA-3AEB103V from Panasonic Electronic Components, Newark, NJ United States) were placed adjacent to the copper traces onto the now exposed transfer tape, with contact pads face down, and then pressed with a small force for a few seconds into the transfer tape to allow adhesion to build.

An encapsulating coating (3M Scotch-Weld Epoxy Adhesive DP100, 3M Company, St. Paul, MN United States) was then applied to the transfer tape to cover the circuit die, resistors, and copper traces. The encapsulant was applied such that it was only slightly thicker than the thickest component and then heat cured. The carrier was then peeled off the transfer tape. The solid circuit die, resistors, and copper traces were all transferred to the carrier such that the top surface of the chip, resistors, and copper traces were nearly flush with the exposed major surface of the carrier.

A film stack with a layered construction of: PCK silicone release treated VHB liner (4.5 mil (0.11 mm) thick)/3M VHB adhesive (2 mil (0.05 mm))/Polyurethane (2 mil (0.05 mm) thick)/1.5 mil (0.04 mm) PET film was drilled with a laser so that the laser cut through all four layers to form a guide layer with a pattern of microchannels arranged to form contacts to the configuration of the copper traces and the contact pads on the solid circuit die and resistors. The laser used to make the guide layer was an Avia 7 UV 355 nm laser with a power of about 3.5-3.6 W. The laser was directed at the PET side of the layered film construction and moved over the layered film construction in 20-30 passes at a speed of 500 mm/sec, with a hatch spacing of 0.025 mm. The microchannels formed in the guide layer were linear with a generally rectangular cross-section, a depth equal to that of the film stack, and a width of about 300 µm.

The PCK release liner was removed, and the guide layer was positioned on the carrier such that the microchannel openings in the guide layer lined up over the exposed copper traces and contact pads of the solid circuit die and resistors. The remaining layers of the guide layer were then laminated to the carrier, such that the adhesive side of the guide layer contacted the cured carrier. The adhesive formed a seal between the guide layer and the surface of the carrier on which the adhesive was applied. The resulting construction 2000 is shown schematically in FIG. 10A, and included a guide layer 2040 applied on the first major surface 2034 of the carrier 2031. In the embodiment of FIG. 10A, the guide layer 2040 included a polymeric film layer 2042, an adhesive layer 2044, and a PET release liner 2045. The guide layer 2040 included an arrangement of microchannels 2050 that extended through the polymeric film layer 2042, the adhesive layer 2044, and the release liner 2045 of the guide layer 2040, and were configured to align with the exposed surfaces of the contact pads 2020 on the electronic device 2018, the additional circuit elements 2021, as well as the exposed conductive metal traces 2016.

Figure 10B:
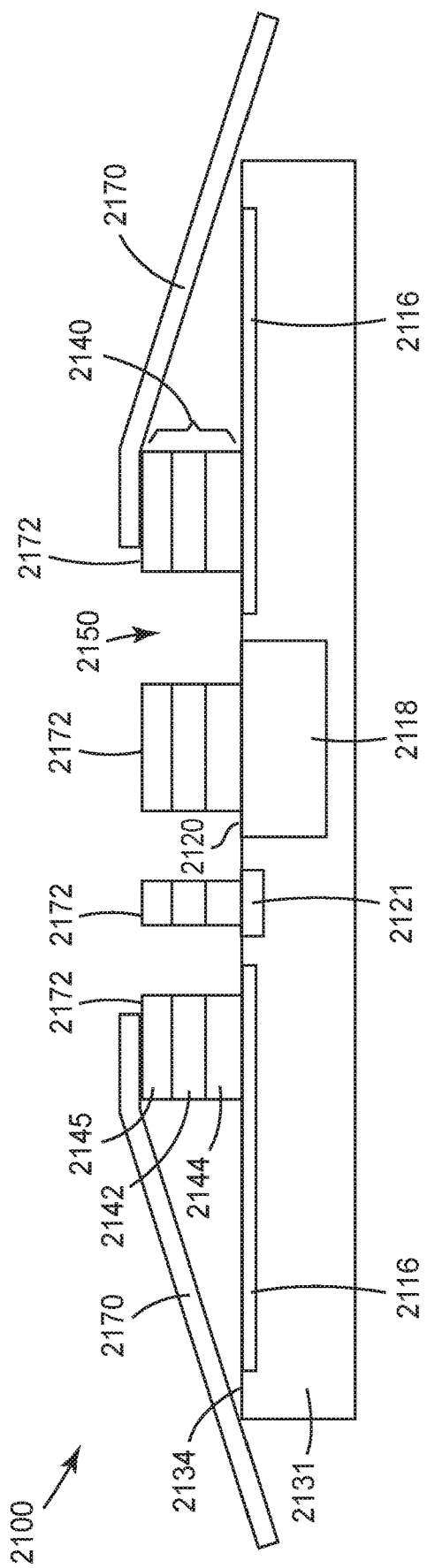
FIG. 10B is a schematic, cross-sectional view of the construction of FIG. 10A having a mask layer thereon.

Referring to the schematic representation in FIG. 10B, in the construction 2100 a mask layer 2170 of PET was applied over the guide layer 2140 and carrier 2131 such that the mask layer covered all of the portions of carrier outside of the guide layer, while still leaving the majority of the top surface of the guide layer 2172 and all of the microchannels 2150 in the guide layer still exposed.

Figure 10C:
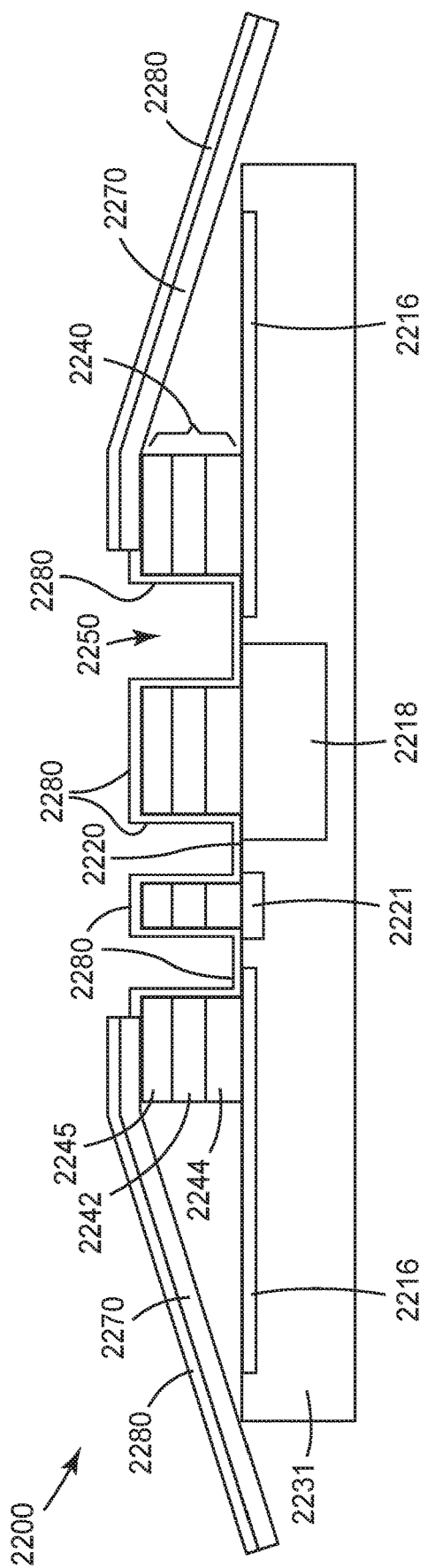
FIG. 10C is a schematic, cross-sectional view of the construction of FIG. 10B having a vapor deposited metal layer thereon.

As shown schematically in FIG. 10C, in the device 2200 the construction 2100 of FIG. 10B was then subjected to DC magnetron sputtering where a 1 micrometer layer of silver 2280 was applied onto the masked surface of the sample and particularly onto the exposed portions of the copper traces 2216 and contact pads 2220 of the circuit die 2218 and additional circuit elements (resistors) 2221 located beneath the microchannels 2250 of the guide layer 2240. To deposit the silver, the sample was attached to a sample holder and loaded into a PVD75 thin film deposition tool (Kurt J Lesker Co, Jefferson Hills, PA United States). The sample was allowed to outgas in the vacuum chamber until a base pressure of 9.3E-4 Pascal (7.0E-6 Torr) was achieved. Prior to sputtering, the chamber pressure was controlled to 0.4 Pascal (3 mTorr by) flowing approximately 53 standard cubic centimeters (sccm) of argon gas (Oxygen Services, Minneapolis, MN). A DC magnetron sputter gun loaded with a silver target, measuring 3 inches (76 mm) diameter×⅛ inch (3.2 mm) thick (Kurt J Lesker Co, Jefferson Hills, PA United States), and sputtered at 200 Watts for 120 seconds to remove any residual material from the target surface of the sample. Then, the sample was exposed to the sputter source and coated for 1740 seconds, while the sample holder rotated at 20 rpm during the deposition.

Figure 10D:
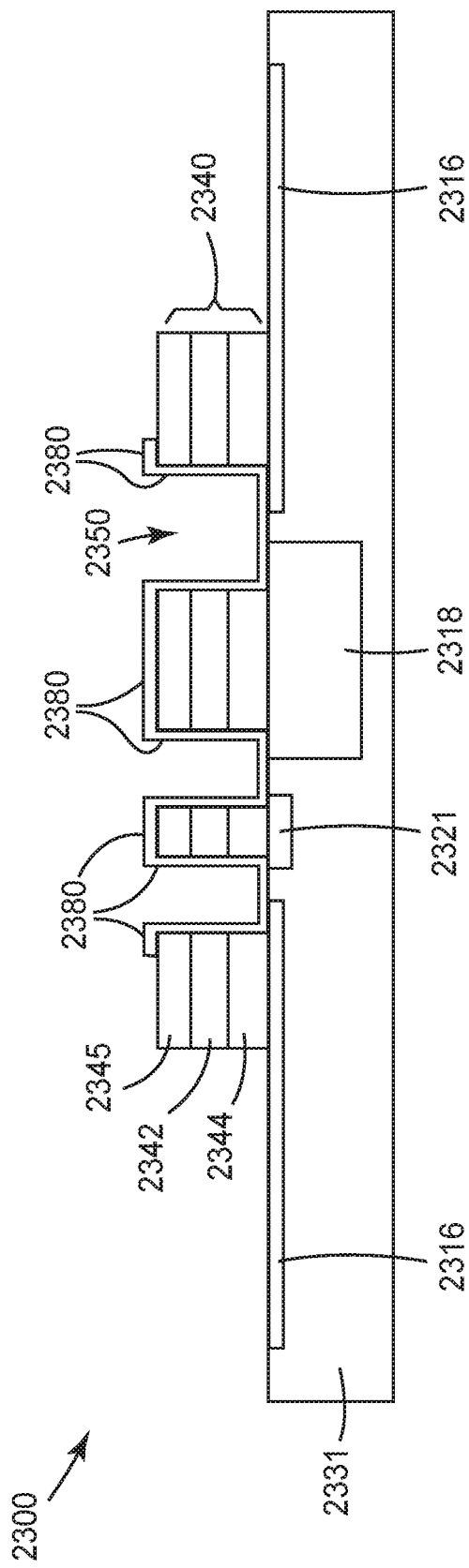
FIG. 10D is a schematic, cross-sectional view of the construction of FIG. 10C in which the mask layer is removed.

Referring now to the schematic diagram in FIG. 10D, after the silver layer 2280 had been deposited as shown in FIG. 10C, the PET mask layer 2270 was manually removed to form the construction 2300.

Figure 10E:
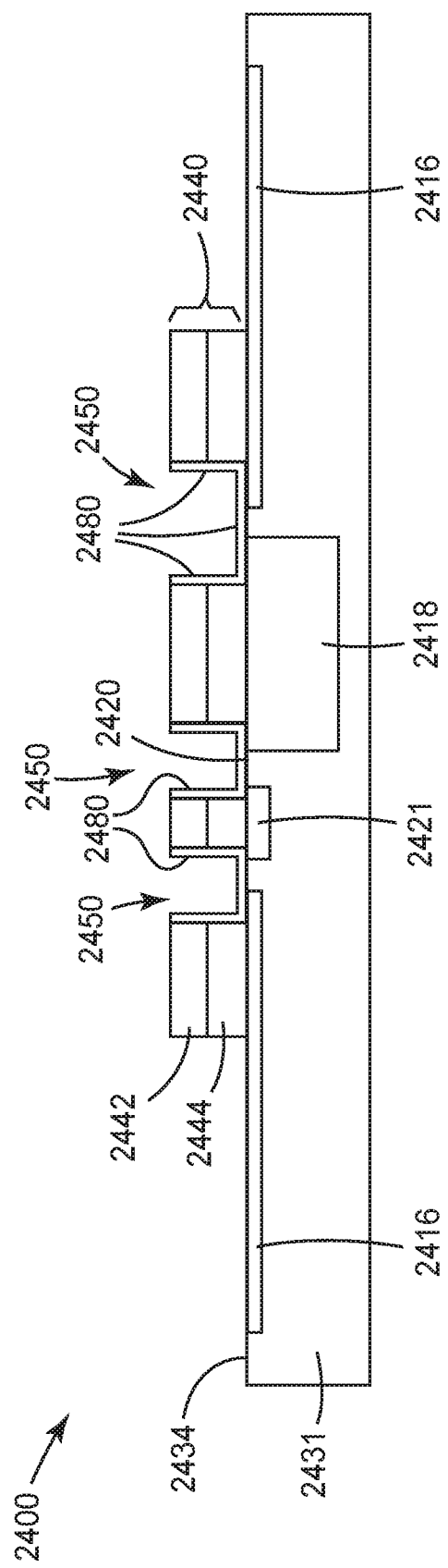
FIG. 10E is a schematic, cross-sectional view of the construction of FIG. 10D after a release liner on the guide layer has been removed.

Next, as shown in FIG. 10E, the top PET layer 2345 of the guide layer 2340 were both manually stripped from the carrier 2331 of the construction 2300 in FIG. 10D to form the construction 2400, effectively leaving behind only the silver 2480 which had been deposited into the microchannels 2450 of the guide layer 2440.

EMBODIMENTS

Embodiment A. An article, comprising: a solid circuit die on a first major surface of a substrate, wherein the solid circuit die comprises an arrangement of contact pads, and wherein at least a portion of the contact pads in the arrangement of contact pads are at least partially exposed on the first major surface of the substrate to provide an arrangement of exposed contact pads; a guide layer comprising an arrangement of microchannels, wherein the guide layer contacts the first major surface of the substrate such that at least some microchannels in the arrangement of microchannels overlie the at least some exposed contact pads in the arrangement of exposed contact pads; and a conductive particle-containing liquid in at least some of the microchannels.

Embodiment B. The article of Embodiment A, wherein the solid circuit die is at least partially embedded in the first major surface of the substrate.

Embodiment C. The article of Embodiment A, wherein the solid circuit die is embedded in the first major surface of the substrate.

Embodiment D. The article of any of Embodiments A to C, wherein the substrate comprises a flexible polymeric material.

Embodiment E. The article of Embodiment D, wherein the substrate comprises a web of polymeric material having an indefinite length.

Embodiment F. The article of any of Embodiments A to E, wherein the microchannels are linear microchannels with a substantially constant width and depth from a first end to a second end thereof.

Embodiment G. The article of any of Embodiments A to F, wherein the conductive particle-containing liquid comprises a conductive ink.

Embodiment H. The article of Embodiment G, wherein the conductive ink comprises a metal chosen from copper, silver, gold and mixtures and combinations thereof.

Embodiment I. The article of any of Embodiments A to H, wherein the guide layer comprises a layer of a polymeric material and a layer of an adhesive material on the layer of polymeric material, wherein the adhesive layer is on the first major surface of the substrate.

Embodiment J. The article of Embodiment I, wherein the layer of polymeric material in the guide layer comprises PET.

Embodiment K. An article, comprising:
a first electronic component on a first major surface of a substrate, wherein the first electronic component comprises a first arrangement of at least partially exposed contact pads on the first major surface of the substrate;
a second electronic component on the first major surface of the substrate, wherein the second electronic component comprises a second arrangement of at least partially exposed contact pads on the first major surface of the substrate;
a guide layer on the first major surface of the substrate, wherein the guide layer comprises an arrangement of microchannels, and wherein at least some microchannels in the arrangement of microchannels comprise a first end overlying at least some contact pads in the first arrangement of exposed contact pads and a second end overlying at least some contact pads in the second arrangement of contact pads; and
a conductive particle-containing liquid in at least some of the microchannels.

Embodiment L. The article of Embodiment K, wherein at least one of the first and the second electronic components are at least partially embedded in the first major surface of the substrate.

Embodiment M. The article of Embodiments K to L, wherein the substrate comprises a flexible polymeric material.

Embodiment N. The article of Embodiment M, wherein the substrate comprises a web of polymeric material having an indefinite length.

Embodiment O. The article of any of Embodiments K to N, wherein the microchannels are linear microchannels with a substantially constant width and depth from a first end to a second end thereof.

Embodiment P. The article of any of Embodiments K to O, wherein the conductive particle-containing liquid comprises an electrically conductive ink, and wherein the conductive ink comprises a metal chosen from copper, silver, gold and mixtures and combinations thereof.

Embodiment Q. The article of any of Embodiments K to P, wherein the guide layer comprises a layer of a polymeric material and a layer of an adhesive material on the layer of polymeric material, wherein the adhesive layer is on the first major surface of the substrate.

Embodiment R. The article of claim Embodiment Q, wherein the layer of polymeric material in the guide layer comprises PET.

Embodiment S. The article of any of Embodiments K to R, wherein the first electronic component is chosen from capacitors, resistors, inductors, diodes, and mixtures and combinations thereof.

Embodiment T. The article of Embodiment S, wherein the second electronic component is chosen from in integrated circuit (IC), a radio frequency identification (RFID) module, a near field communication (NFC) module, and mixtures and combinations thereof.

Embodiment U. A method for manufacturing an electronic device, comprising:
placing a solid circuit die with one or more contact pads on a first major surface of a substrate such that the one or more contact pads contacts the first major surface of the substrate to provide an at least partially sealed contact pad;
placing an electrically conductive trace on the first major surface of the substrate, wherein the electrically conductive trace has a first exposed major surface and a second surface, wherein the second surface of the electrically conductive trace contacts the first major surface of the substrate to provide an at least partially sealed electrically conductive trace;
applying a liquid encapsulant over the first major surface of the substrate and the solid circuit die;

hardening the liquid encapsulant to form a carrier with a first major surface contacting the first major surface of the substrate and forming an interface therewith;

separating the carrier and the substrate at the interface to expose: (1) the at least partially sealed one or more contact pads on the first major surface of the carrier to provide an at least partially exposed one or more contact pads, and (2) the at least partially sealed electrically conductive trace to provide an at least partially exposed electrically conductive trace surface;

applying a guide layer on the first major surface of the carrier, wherein the guide layer comprises a microchannel with a first end overlying the at least partially exposed contact pad and a second end overlying the exposed at least partially exposed electrically conductive trace surface;

depositing a conductive particle-containing liquid in the microchannel to contact the at least partially exposed one or more contact pads and the at least partially exposed electrically conductive trace and form an interconnection therebetween; and solidifying the conductive particle-containing liquid to form an electrically conductive trace in the microchannel.

Embodiment V. The method of Embodiment U, wherein the substrate comprises a flexible polymeric material.

Embodiment W. The method of Embodiment V, wherein the substrate comprises a web of polymeric material having an indefinite length.

Embodiment X. The method of any of Embodiments U to W, wherein the solid circuit die is chosen from a semiconductor die, an integrated circuit (IC), a radio frequency identification (RFID) module, a near field communication (NFC) module, and mixtures and combinations thereof.

Embodiment Y. The method of any of Embodiments U to X, comprising softening the substrate prior to placing the solid circuit die thereon.

Embodiment Z. The method of any of Embodiments U to Y, wherein the contact pad is on a bottom surface of the solid circuit die.

Embodiment AA. The method of any of Embodiments U to Z, wherein the microchannel is a linear microchannel with a substantially constant width and depth from the first end to the second end thereof.

Embodiment BB. The method of Embodiment AA, wherein the conductive particle-containing liquid is applied to the microchannel between the first and the second ends thereof and flows primarily through capillary pressure between the first and the second ends thereof.

Embodiment CC. The method of any of Embodiments U to BB, wherein the conductive particle-containing liquid is deposited in the microchannel by blading.

Embodiment DD. The method of any of Embodiments U to CC, wherein the conductive particle-containing liquid comprises a conductive ink comprising a metal chosen from copper, silver, gold, and mixtures and combinations thereof.

Embodiment EE. The method of any of Embodiments U to DD, wherein the guide layer comprises a layer of a polymeric material.

Embodiment FF. The method of Embodiment EE, wherein the guide layer further comprises an adhesive layer on the layer of polymeric material, and wherein the adhesive layer contacts the first major surface of the carrier.

Embodiment GG. The method of Embodiment FF, wherein the guide layer further comprises a removable release liner on the adhesive layer, and wherein the release liner is peeled from the adhesive layer prior to the laminating step.

Embodiment HH. The method of any of Embodiments U to GG, wherein the liquid encapsulant is hardened with UV radiation.

Embodiment II. The method of Embodiment HH, wherein the liquid encapsulant comprises a UV curable epoxy compound.

Embodiment JJ. The method of any of Embodiments U to II, wherein the liquid encapsulant is thermally hardened.

Embodiment KK. The method of any of Embodiments U to JJ, further comprising removing residual encapsulant material from the at least partially sealed contact pad and the at least partially sealed electrically conductive trace to provide an exposed contact pad and an exposed electrically conductive trace surface.

Embodiment LL. The method of Embodiment KK, wherein the residual encapsulant material is abrasively removed.

Embodiment MM. The method of Embodiment KK, wherein the residual encapsulant material is removed with reactive ion etching.

Embodiment NN. The method of claim Embodiment KK, wherein the residual encapsulant material is removed with chemical etching.

Embodiment OO. A method for manufacturing an electronic device, comprising:
    placing a first electronic component with a first arrangement of contact pads on a first major surface of a flexible polymeric substrate such that the first arrangement of contact pads at least partially embeds in the first major surface of the substrate to provide a first arrangement of embedded contact pads;
    placing a second electronic component with a second arrangement of contact pads on the first major surface of the substrate such that the second arrangement of contact pads at least partially embeds in the first major surface of the substrate to provide a second arrangement of embedded contact pads;
    applying a liquid encapsulant over the first major surface of the substrate and the first and the second electronic components;
    hardening the liquid encapsulant to form a carrier with a first major surface contacting the first major surface of the substrate and forming an interface therewith;
    separating the carrier and the substrate at the interface to expose on the first major surface of the carrier the first arrangement of embedded contact pads and the second arrangement of embedded contact pads to provide a first arrangement of exposed contact pads extending from the first major surface of the carrier and a second arrangement of exposed contact pads extending from the first major surface of the carrier;
    forming a guide layer comprising an arrangement of microchannels;
    laminating the guide layer to the first major surface of the carrier such that first ends of at least some microchannels in the arrangement of microchannels overlie at least some exposed contact pads of the first arrangement of exposed contact pads and second ends of the at least some microchannels in the arrangement of microchannels overlie at least some exposed contact pads of the second arrangement of exposed contact pads;
    depositing a conductive particle-containing liquid in the microchannels to contact the at least some exposed contact pads in the first arrangement of exposed contact pads and the at least some exposed contact pads in the second arrangement of exposed contact pads to form an interconnection therebetween; and solidifying the conductive particle-containing liquid to form electrically conductive traces in the microchannels.

Embodiment PP. The method of Embodiment OO, wherein the substrate comprises a flexible polymeric material.

Embodiment QQ. The method of Embodiment PP, wherein the substrate comprises a web of polymeric material having an indefinite length.

Embodiment RR. The method of any of Embodiments OO to QQ, wherein the first electronic component is chosen from capacitors, resistors, inductors, diodes, and mixtures and combinations thereof.

Embodiment SS. The method of Embodiment RR, wherein the second electronic component is chosen from an integrated circuit (IC), a radio frequency identification (RFID) module, a near field communication (NFC) module, and mixtures and combinations thereof.

Embodiment TT. The method of any of Embodiments OO to SS, comprising softening the flexible polymeric substrate prior to placing at least one of the first electronic component and the second electronic component thereon.

Embodiment UU. The method of any of Embodiments OO to TT, wherein the microchannels are linear microchannels with a substantially constant width and depth from the first end to the second end thereof.

Embodiment WW. The method of any of Embodiments OO to UU, wherein the conductive particle-containing liquid is applied to the microchannels between the first ends and the second ends thereof and flows primarily through capillary pressure between the first ends and the second ends.

Embodiment XX. The method of Embodiment OO, wherein the conductive particle-containing liquid is deposited in the microchannels by blading.

Embodiment YY. The method of any of Embodiments OO to XX, wherein the conductive particle-containing liquid comprises a conductive ink, the conductive ink comprising a metal chosen from copper, silver, gold, and mixtures and combinations thereof.

Embodiments ZZ. The method of any of Embodiments OO to YY, wherein the guide layer comprises a layer of a polymeric material, a layer of an adhesive material on the layer of polymeric material, and a removable release liner on the layer of the adhesive material, wherein the release liner is peeled from the adhesive layer prior to the laminating step such that the adhesive layer is applied on the first major surface of the encapsulant material.

Embodiment AAA. The method of Embodiment ZZ, wherein the layer of polymeric material in the guide layer comprises PET.

Embodiment BBB. The method of any of Embodiments ZZ and AAA, wherein forming the guide layer comprises laser drilling through the polymeric layer and the adhesive layer to form the arrangement of microchannels.

Embodiment CCC. A method for manufacturing an electronic device, comprising:
placing a solid circuit die with one or more contact pads on a first major surface of a substrate such that the one or more contact pads contacts the first major surface of the substrate to provide an at least partially sealed contact pad;
placing an electrically conductive trace on the first major surface of the substrate, wherein the electrically conductive trace has a first exposed major surface and a second surface, wherein the second surface of the electrically conductive trace contacts the first major surface of the substrate to provide an at least partially sealed electrically conductive trace;
applying a liquid encapsulant over the first major surface of the substrate, the solid circuit die and the electrically conductive trace;
hardening the liquid encapsulant to form a carrier with a first major surface contacting the first major surface of the substrate and forming an interface therewith;
separating the carrier and the substrate at the interface to expose: (1) the at least partially sealed one or more contact pads on the first major surface of the carrier to provide an at least partially exposed one or more contact pads, and (2) the at least partially sealed electrically conductive trace to provide an at least partially exposed electrically conductive trace surface;
laminating a guide layer on the first major surface of the carrier, wherein the guide layer comprises a microchannel with a first end overlying the at least partially exposed contact pad and a second end overlying the exposed at least partially exposed electrically conductive trace surface;
applying a mask layer over the guide layer and the first major surface of the carrier, wherein the microchannel in the guide layer remains exposed;
vapor depositing a conductive particle-containing liquid on the mask layer and in the microchannel of the guide layer, wherein the conductive particle-containing liquid contacts the at least partially exposed one or more contact pads and the at least partially exposed electrically conductive trace and form an interconnection therebetween;
solidifying the conductive particle-containing liquid to form an electrically conductive trace in the microchannel; and
removing the mask layer.

Embodiment DDD. The method of Embodiment CCC, wherein the guide layer further comprises a release liner on an exposed surface thereof, and the release liner is removed from the guide layer after removing the mask layer.

Embodiment EEE. The method of any of Embodiments CCC to DDD, wherein the microchannel is formed in the guide layer by a process chosen from microreplication, laser drilling, and combinations thereof.

Various embodiments of the invention have been described. These and other embodiments are within the scope of the following claims.

The invention claimed is:

1. A method for manufacturing an electronic device, comprising:
placing a solid circuit die with one or more contact pads on a first major surface of a substrate such that the one or more contact pads contacts the first major surface of the substrate to provide an at least partially sealed contact pad;
placing an electrically conductive trace on the first major surface of the substrate, wherein the electrically conductive trace has a first exposed major surface and a second surface, wherein the second surface of the electrically conductive trace contacts the first major surface of the substrate to provide an at least partially sealed electrically conductive trace;
applying a liquid encapsulant over the first major surface of the substrate and the solid circuit die;

hardening the liquid encapsulant to form a carrier with a first major surface contacting the first major surface of the substrate and forming an interface therewith;

separating the carrier and the substrate at the interface to expose: (1) the at least partially sealed one or more contact pads on the first major surface of the carrier to provide an at least partially exposed one or more contact pads, and (2) the at least partially sealed electrically conductive trace to provide an at least partially exposed electrically conductive trace surface;

applying a guide layer on the first major surface of the carrier, wherein the guide layer comprises a microchannel with a first end overlying the at least partially exposed contact pad and a second end overlying the exposed at least partially exposed electrically conductive trace surface;

depositing a conductive particle-containing liquid in the microchannel to contact the at least partially exposed one or more contact pads and the at least partially exposed electrically conductive trace and form an interconnection therebetween; and solidifying the conductive particle-containing liquid to form an electrically conductive trace in the microchannel.

2. The method of claim 1, wherein the substrate comprises a flexible polymeric material.

3. The method of claim 1, wherein the solid circuit die is chosen from a semiconductor die, an integrated circuit (IC), a radio frequency identification (RFID) module, a near field communication (NFC) module, and mixtures and combinations thereof.

4. The method of claim 1, comprising softening the substrate prior to placing the solid circuit die thereon.

5. The method of claim 1, wherein the conductive particle-containing liquid is deposited in the microchannel between the first and the second ends thereof and flows primarily through capillary pressure between the first and the second ends thereof.

6. The method of claim 1, wherein the conductive particle-containing liquid is deposited in the microchannel by blading.

7. The method of claim 1, wherein the guide layer comprises a layer of a polymeric material, and an adhesive layer on the layer of polymeric material, and wherein the adhesive layer contacts the first major surface of the carrier.

8. The method of claim 7, wherein the guide layer further comprises a removable release liner on the adhesive layer, and wherein the release liner is peeled from the adhesive layer prior to the applying step.

9. A method for manufacturing an electronic device, comprising:

placing a solid circuit die with one or more contact pads on a first major surface of a substrate such that the one or more contact pads contacts the first major surface of the substrate to provide an at least partially sealed contact pad;

placing an electrically conductive trace on the first major surface of the substrate, wherein the electrically conductive trace has a first exposed major surface and a second surface, wherein the second surface of the electrically conductive trace contacts the first major surface of the substrate to provide an at least partially sealed electrically conductive trace;

applying a liquid encapsulant over the first major surface of the substrate, the solid circuit die and the electrically conductive trace;

hardening the liquid encapsulant to form a carrier with a first major surface contacting the first major surface of the substrate and forming an interface therewith;

separating the carrier and the substrate at the interface to expose: (1) the at least partially sealed one or more contact pads on the first major surface of the carrier to provide an at least partially exposed one or more contact pads, and (2) the at least partially sealed electrically conductive trace to provide an at least partially exposed electrically conductive trace surface;

laminating a guide layer on the first major surface of the carrier, wherein the guide layer comprises a microchannel with a first end overlying the at least partially exposed contact pad and a second end overlying the exposed at least partially exposed electrically conductive trace surface;

applying a mask layer over the guide layer and the first major surface of the carrier, wherein the microchannel in the guide layer remains exposed;

vapor depositing a conductive particle-containing liquid on the mask layer and in the microchannel of the guide layer, wherein the conductive particle-containing liquid contacts the at least partially exposed one or more contact pads and the at least partially exposed electrically conductive trace and form an interconnection therebetween;

solidifying the conductive particle-containing liquid to form an electrically conductive trace in the microchannel; and removing the mask layer.

10. The method of claim 9, wherein the guide layer further comprises a release liner on an exposed surface thereof, and the release liner is removed from the guide layer after removing the mask layer.

* * * * *